United States Patent
Han et al.

(10) Patent No.: US 11,664,810 B2
(45) Date of Patent: May 30, 2023

(54) CONTROL SIGNAL PULSE WIDTH EXTRACTION-BASED PHASE-LOCKED ACCELERATION CIRCUIT AND PHASE-LOCKED LOOP SYSTEM

(71) Applicant: AMICRO SEMICONDUCTOR CO., LTD., Guangdong (CN)

(72) Inventors: Huaiyu Han, Guangdong (CN); Yaohua Shao, Guangdong (CN); Weibing Zhao, Guangdong (CN)

(73) Assignee: AMICRO SEMICONDUCTOR CO., LTD., Guangdong (CN)

( * ) Notice: Subject to any disclaimer, the term of this patent is extended or adjusted under 35 U.S.C. 154(b) by 0 days.

(21) Appl. No.: 17/637,821

(22) PCT Filed: Nov. 11, 2019

(86) PCT No.: PCT/CN2019/117034
§ 371 (c)(1),
(2) Date: Feb. 24, 2022

(87) PCT Pub. No.: WO2021/068326
PCT Pub. Date: Apr. 15, 2021

(65) Prior Publication Data
US 2022/0294458 A1    Sep. 15, 2022

(30) Foreign Application Priority Data

Oct. 7, 2019  (CN) .......................... 201910946793.9

(51) Int. Cl.
*H03L 7/089* (2006.01)
*H03L 7/081* (2006.01)
(Continued)

(52) U.S. Cl.
CPC ............ *H03L 7/0895* (2013.01); *H03L 7/081* (2013.01); *H03L 7/093* (2013.01); *H03L 7/099* (2013.01);
(Continued)

(58) Field of Classification Search
CPC ............ H03L 7/093; H03L 7/085; H03L 7/08
See application file for complete search history.

(56) References Cited

U.S. PATENT DOCUMENTS 6,975,148 B2 * 12/2005 Miyata .................. H03L 7/0995
327/156
9,455,723 B2 *  9/2016 Vahid Far ............. H03L 7/0802
2005/0111605 A1   5/2005 Loke et al.

FOREIGN PATENT DOCUMENTS

CN          102882520 A     1/2013
CN          108718195 A    10/2018
(Continued)

*Primary Examiner* — Diana J. Cheng
(74) *Attorney, Agent, or Firm* — Gang Yu

(57) ABSTRACT

Disclosed are a control signal pulse width extraction-based phase-locked acceleration circuit and a phase-locked loop system, the phase-lock acceleration circuit includes a pulse width extraction control circuit and a current injection switch module; the control output terminal of the pulse width extraction control circuit is connected to the current injection control terminal of the current injection switch module, and the stepping current control terminal of the current injection switch module and the driving input terminal of the pulse width extraction control circuit are both connected to the preset control signal output end of a phase frequency detector for use in controlling, according to pulse width changes of signals outputted by the preset control signal output end, the current injection switch module to inject charges until the phases of a reference clock signal and feedback clock signal inputted by the phase frequency detector are synchronized.

13 Claims, 5 Drawing Sheets

(51) Int. Cl.
*H03L 7/093* (2006.01)
*H03L 7/099* (2006.01)
*H03L 7/10* (2006.01)
*H03L 7/18* (2006.01)

(52) U.S. Cl.
CPC .................. *H03L 7/10* (2013.01); *H03L 7/18* (2013.01); *H03L 2207/06* (2013.01)

(56) References Cited

FOREIGN PATENT DOCUMENTS

| | | | |
|---|---|---|---|
| CN | 109921790 | A | 6/2019 |
| EP | 1241791 | A3 | 9/2004 |
| GB | 2285547 | A | 7/1995 |

* cited by examiner

CONTROL SIGNAL PULSE WIDTH EXTRACTION-BASED PHASE-LOCKED ACCELERATION CIRCUIT AND PHASE-LOCKED LOOP SYSTEM

The present disclosure takes the Chinese Patent Application No. 201910946793.9, filed on Oct. 7, 2019, and entitled "control signal pulse width extraction-based phase-locked acceleration circuit and phase-locked loop system", as the priority, the entire contents of which are incorporated herein by reference.

TECHNICAL FIELD

The present disclosure belongs to the technical field of phase-locked loops, in particular to a control signal pulse width extraction-based phase-locked acceleration circuit and a phase-locked loop system.

BACKGROUND ART

Phase-locked loop (PLL) is a very important functional system, for example, providing a clock with one or more frequency requirements in a chip system, generating a local oscillation signal in a receiver, keeping synchronous in a communication system, etc. For these systems, fast locking of the phase-locked loop is always a goal to pursue. Mutually restrained by factors such as stability, dynamic response, precision and noise, etc., the phase-locked speed is difficult to further improve.

In the phase-locked loop, a phase frequency detector, a charge pump, a low pass filter, a voltage-controlled oscillator and a frequency divider form a feedback loop, a feedback clock signal Ffb of a high frequency output signal of the voltage-controlled oscillator divided in frequency and a reference clock signal Fref generated by a crystal oscillator are input into the phase frequency detector, the phase frequency detector compares a phase difference between two input signals to generate an output voltage, the output voltage controls the charge pump to generate a charge or discharge current, and the current charges or discharges the low pass filter, which leads to increase or decrease a control voltage VC output by the low pass filter, as an input signal of the voltage-controlled oscillator, VC regulates an output signal frequency of the voltage-controlled oscillator, and then the output signal of the voltage-controlled oscillator is divided in frequency by the frequency divider to obtain the feedback clock signal Ffb which is transmitted to the phase frequency detector, and lock the phase-locked loop when the phase of the reference clock signal Fref and the feedback clock signal Ffb is consistent or differ by a fixed value by means of a negative feedback characteristic of the loop. Thus, an output signal Fout with frequency and phase locked to fixed frequency and phase may be generated by means of the phase-locked loop circuit. By comparing the reference clock signal Fref with the feedback clock signal Ffb by the phase frequency detector, for change an output frequency, the control voltage of the voltage-controlled oscillator is regulated till phase lock is stable. When phase lock is stable, a frequency of the reference clock signal and an output frequency of the voltage-controlled oscillator is equal or in a relationship of N times. However, in the process, a delay time of the loop fed back is longer and a phase lock time of the phase-locked loop is longer.

SUMMARY

The present disclosure provides a technical scheme as follows: according to a control signal pulse width extraction-based phase-locked acceleration circuit, phase-locked loops suitable for the phase-locked acceleration circuit includes a phase frequency detector, a charge pump, a low pass filter, a voltage-controlled oscillator and a frequency divider, wherein the phase frequency detector, the charge pump, the low pass filter, the voltage-controlled oscillator and the frequency divider are connected in turn to form a feedback loop. The phase-locked acceleration circuit includes a pulse width extraction control circuit and a current injection switch module; the pulse width extraction control circuit includes a driving input terminal, an enabling control terminal and a control output terminal; the current injection switch module includes a current step-by-step control terminal and a current injection control terminal; the enabling control terminal of the pulse width extraction control circuit is connected with an external enabling signal source and is configured to control the phase-locked loop to work; the control output terminal of the pulse width extraction control circuit is connected with the current injection control terminal of the current injection switch module, both the current step-by-step control terminal of the current injection switch module and the driving input terminal of the pulse width extraction control circuit are connected to a preset control signal output terminal of the phase frequency detector respectively, so as to control the current injection switch module to inject charges into the low pass filter according to a change of pulse width of a output signal of the preset control signal output terminal until a phase of a reference clock signal and a phase of a feedback clock signal which are inputted by the phase frequency detector are synchronized; the output signal of the preset control signal output terminal is an inverted signal of a control signal output by the phase frequency detector to control the charge pump to inject charges; a signal input terminal of the low pass filter is connected with a signal output terminal of the charge pump, a capacitance input terminal of the low pass filter is connected with a signal output terminal of the current injection switch module, so as to receive charges injected by the signal output terminal of the current injection switch module while receiving charges provided by the signal output terminal of the charge pump and to generate a control voltage from accumulated charges and output the control voltage to the voltage-controlled oscillator, the capacitance input terminal of the low pass filter is a connective node of a resistor and a capacitor in series in a resistance-capacitance series branch in the low pass filter.

Optionally, the current injection switch module includes a power supply, a first zero N-Metal-Oxide-Semiconductor (NMOS) tube, a second zero NMOS tube and a first zero Positive-channel-Metal-Oxide-Semiconductor (PMOS) tube, a source electrode of the first zero NMOS tube is connected with a drain electrode of the second zero NMOS tube, a gate electrode of is connected with a drain electrode of the first zero NMOS tube, and the drain electrode is connected with the power supply, such that the first zero NMOS tube is taken as a current limiting MOS tube; a drain electrode of the second zero NMOS tube is connected with the source electrode of the first zero NMOS tube, a source electrode is connected with a source electrode of the first zero PMOS tube, and a gate electrode is connected with the preset control signal output as the step-by-step control terminal of the current injection switch module, and the gate electrode of the second zero NMOS is configured to change a conduction condition of the second zero NMOS tube according to a jump state of the output signal of the preset control signal output terminal to inject current step-by-step by the current injection switch module; the source electrode of the first zero PMOS is connected with the source electrode of the second zero NMOS tube, and a gate electrode is connected with the control output terminal of the pulse width extraction control circuit as the current injection control terminal of the current injection switch module; and a drain electrode as a signal output terminal of the current injection switch module is connected with the capacitance input terminal of the low pass filter.

Optionally, the delay control module includes a pulse width extraction array, a delay level generation array and a control signal generation module, wherein the driving input terminal is connected with a clock input terminal arranged in the delay level generation array, and the enabling control terminal is connected with a data input terminal arranged in the delay level generation array; the delay level generation array internally includes (n+3) cascaded D triggers which are corresponding to (n+3) data output, a D trigger connected with the enabling control terminal is a first level D trigger, the number of stages of cascaded pulse width extraction units is the same as a smaller stage of two adjacent cascaded D triggers connected with the cascaded pulse width extraction unit; the pulse width extraction array includes (n+2) cascaded pulse width extraction units, each of the (n+2) cascaded pulse width extraction units includes two pulse input terminals, one charge discharge control terminal, one driving terminal and one pulse width information output terminal, two adjacent cascaded pulse width extraction units share a common pulse input terminal, and the driving terminals of the (n+2) cascaded pulse width extraction units are connected with a time clock input terminal arranged in the delay level generation array; the data output terminals of the two adjacent cascaded D triggers in the delay level generation array are correspondingly connected to two pulse input terminals of the pulse width extraction unit with matched stage number in the pulse width extraction array; and in the delay level generation array, an inverting output terminal of each of the D triggers connected with the enabling control terminal is connected with the charge discharge control terminal of each of the pulse with extraction units; a non-inverting input terminal and a inverting input terminal of each of the n comparators are respectively connected with the pulse width information output terminals of two adjacent cascaded pulse width extraction unit, each of two adjacent comparators has only one input terminal connected to the pulse width information output terminal of one pulse width extraction unit, properties of input terminals of the two adjacent comparators connected with one pulse width information output terminal of one pulse width extraction unit are different, and the input terminals of two comparators which are not adjacent are not connected with one pulse width information output terminal of one pulse width extraction unit.

Optionally, in the delay level generation array, a connecting structure of the (n+3) cascaded D triggers as follows: a data input terminal of the first D trigger is connected with the enabling control terminal; in two adjacent cascaded D triggers, a data input terminal of a next D trigger is connected with a data output terminal of a previous D trigger; and a clock terminal of each D trigger is connected with the driving input terminal, and a reset terminal of each D trigger is connected with the enabling control terminal.

Optionally, the pulse width extraction array includes a power supply and the (n+2) cascaded pulse width extraction units. Each of the (n+2) cascaded pulse width extraction units includes a pulse width testing NMOS tube, a pulse width testing PMOS tube, a switching PMOS tube, a reset control NMOS tube and a capacitor. In the previous pulse width extraction unit, the gate electrode of the pulse width testing NMOS tube is connected with the data output terminal of the first D trigger in the delay level generation array, wherein the first and current pulse width extraction units are equal, the second D trigger and the first D trigger are in an adjacent cascaded connecting relationship to meet a condition that data output terminals of the two adjacent cascaded D triggers in the delay level generation array are correspondingly connected to two pulse input terminals of the pulse width extraction units with matched stage number in the pulse width extraction array, and the gate electrode of the pulse width testing NMOS tube and the gate electrode of the pulse width testing PMOS tube are taken as the two pulse input terminals respectively; in each pulse width extraction unit, a source electrode of the pulse width testing PMOS tube is connected with the power supply, a drain electrode of the pulse width testing PMOS tube is connected with a drain electrode of the pulse width testing NMOS tube, a source electrode of the pulse width testing NMOS tube is connected with a source electrode of the switching PMOS tube, the gate electrode of the switching PMOS tube is taken as the driving terminal of the pulse width extraction unit, a gate electrode of the reset control NMOS tube is taken as the charge discharge control terminal, a drain electrode of the reset control NMOS tube is connected with a drain electrode of the switching PMOS tube and an upper plate of the capacitor, a connective node of the drain electrode of the reset control NMOS tube and the upper plate of the capacitor is taken as a pulse width information output terminal, and a lower plate of the capacitor and a source electrode of the reset control NMOS tube are earthed; the gate electrodes of the switching PMOS tubes of all the cascaded pulse width extraction units are connected to the clock input terminal and the gate electrodes of the reset control switching NMOS tubes of all the cascaded pulse width extraction units are connected to a inverting output terminal of the first D trigger.

In combination with the technical scheme, in the (n+2) cascaded pulse width extraction units, a ratio between capacitances of the two adjacent cascaded pulse width extraction units is a preset numerical value which is smaller than 1.

Optionally, the control signal generation module includes the n comparators, an or-logic circuit and a switching D trigger, the non-inverting input terminal and the inverting input terminal of each of the n comparators are respectively connected with the pulse width information output terminals of the two adjacent cascaded pulse width extraction unit respectively from a second stage pulse width extraction unit according to a cascading sequence in the pulse width extraction array, the inverting input terminal of the comparator is connected with the pulse width information output terminal of the pulse width extraction unit with a smaller stage, and the non-inverting input terminal of the comparator is connected with the pulse width information output terminal of the pulse width extraction unit with the greater stage; signal output terminals of the n comparators are connected to n input terminals of the or-logic circuit respectively, output terminal of the or-logic circuit is connected to a clock terminal of the switching D trigger, both data input terminal and a reset terminal of the switching D trigger are connected with the enabling control terminal, and a data output terminal of the switching D trigger is taken as the control output terminal of the pulse width extraction control circuit. The or-logic circuit includes a plurality of or gates or corresponding combinational logic circuits.

A phase-locked loop system includes a phase frequency detector which generates a pulse control signal; a charge pump, configured to generate a charge current and a discharge current according to the pulse control signal output by the phase frequency detector; a low pass filter, configured to convert a current control signal output by the charge pump into a control voltage and filter out high frequency noises; a voltage-controlled oscillator, configured to control a oscillating frequency of a output signal of the voltage-controlled oscillator according to the control voltage output by the low pass filter, increase the oscillating frequency of the output signal when the control voltage increases and decrease the oscillating frequency of the output signal when the control voltage decreases, and keeping the oscillating frequency of the output signal at a constant value when the control voltage is stable; a frequency divider, configured to divide a frequency of the output signal of the voltage-controlled oscillator to generate the feedback clock signal of the phase frequency detector, wherein the phase frequency detector, the charge pump, the low pass filter, the voltage-controlled oscillator and the frequency divider are connected in turn to form a feedback loop. A phase-locked loop system further includes a phase-locked acceleration circuit. The pulse width extraction control circuit of the phase-locked acceleration circuit controls a condition that a current injection switch module of the phase-locked acceleration circuit injects charges into the low pass filter according to a change condition of a duty ratio of an inverted signal of the pulse control signal output by the phase frequency detector until the phases of a reference clock signal and the feedback clock signal input by the phase frequency detector are synchronized, such that the phase-locked acceleration circuit shortens a phase-locked time of the feedback loop.

DETAILED DESCRIPTION OF THE EMBODIMENTS

Detailed description will be made on technical scheme in the embodiment of the present disclosure below in combination with drawings in the embodiment of the present disclosure. It should be noted that port name tags at the circuit port below are signal voltages input and output by the port correspondingly.

Figure 1:
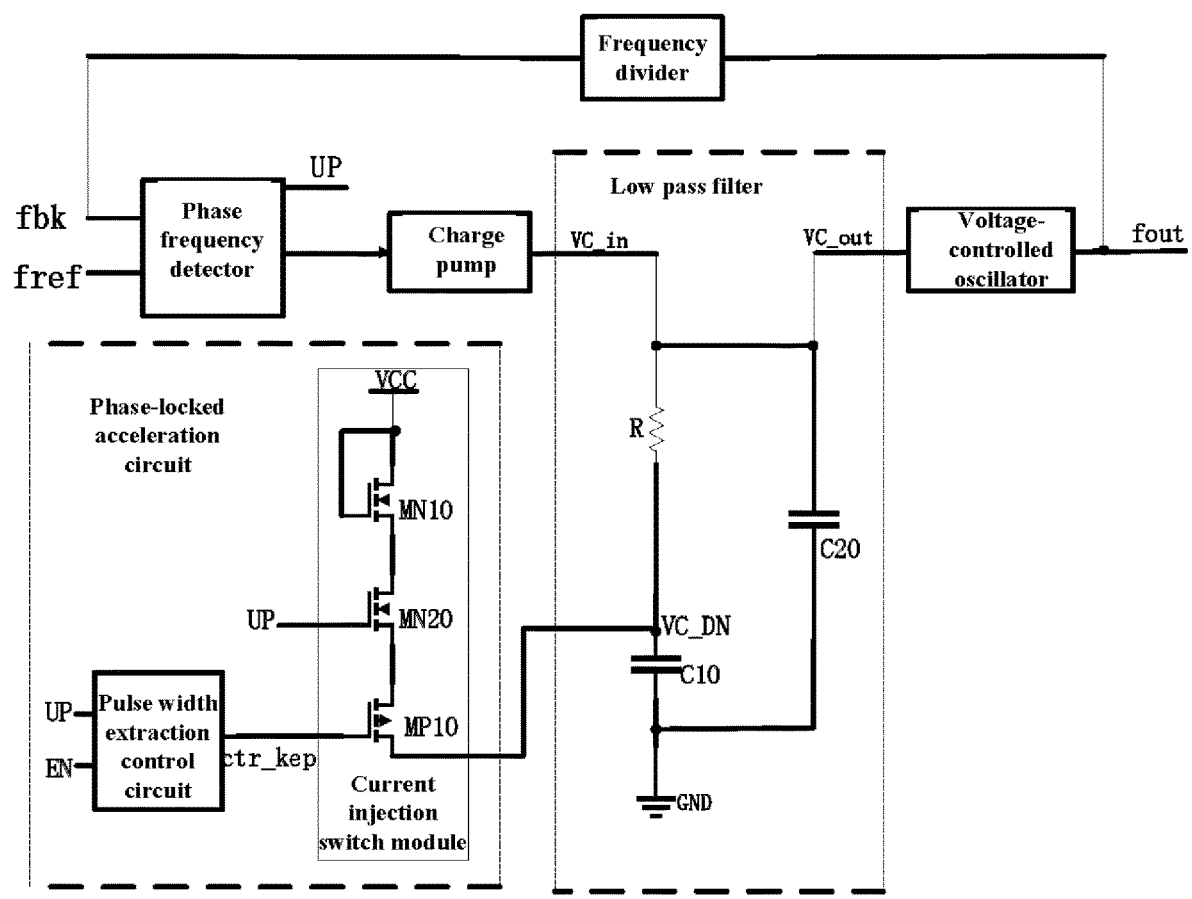
FIG. 1 is a frame schematic diagram of a phase-locked loop system provided by an embodiment of the present disclosure.
Figure 2:
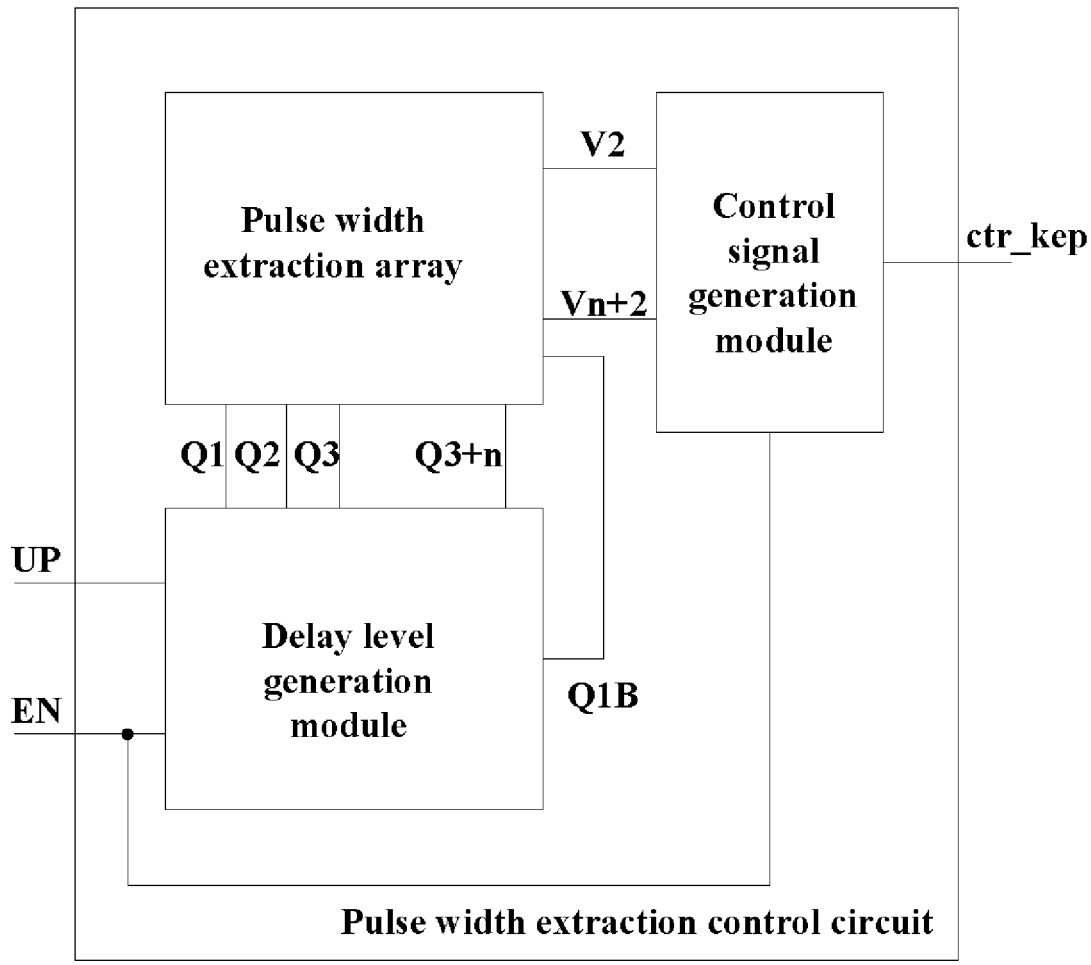
FIG. 2 is a structural schematic diagram of a pulse width extraction control circuit applied to a phase-locked loop system shown in FIG. 1.

The embodiment of the present disclosure provides a control signal pulse width extraction-based phase-locked acceleration circuit. As shown in FIG. 1, phase-locked loops suitable for the phase-locked acceleration circuit comprising a phase frequency detector, a charge pump, a low pass filter, a voltage-controlled oscillator and a frequency divider, and the phase frequency detector, the charge pump, the low pass filter, the voltage-controlled oscillator and the frequency divider are connected in turn to form a feedback loop. The phase-locked acceleration circuit is further provided with a pulse width extraction control circuit and a current injection switch module based on the conventional phase-locked loop. The phase-lock acceleration circuit drives a pulse width extraction control circuit to control a condition that a current injection switch module injects charges into a low pass filter step by step by utilizing a control signal, reflecting a phase relationship between a reference clock signal and a feedback clock signal, output by a phase frequency detector and start a function of injecting the current into the low pass filter step-by-step until the phases of the reference clock signal fref and the feedback clock signal fbk inputted by the phase frequency detector are synchronized, and phase synchronous change of the reference clock signal fref and the feedback clock signal fbk is realized (i.e., phase synchronization), such that the time delay of the feedback loop is counteracted and the phase-locked time is shortened while overshoot of a control voltage input into the voltage-controlled oscillator is avoided.

As shown in FIG. 1, the pulse width extraction control circuit includes a driving input terminal UP, an enabling control terminal EN and a control output terminal ctr_kep. The current injection switch module includes a current step-by-step control terminal UP and a current injection control terminal ctr_kep, that is, the control output terminal ctr_kep of the pulse width extraction control circuit is connected with the current injection control terminal ctr_kep of the current injection switch module; the enabling control terminal EN of the pulse width extraction control circuit is connected with an external enabling signal source EN, and the enabling signal source EN is configured to control the feedback loop to work to start to regulate the phase relationship between the reference clock signal fref and the feedback clock signal fbk automatically. Meanwhile, both the current step by step input control terminal UP of the current injection switch module and the driving input terminal UP of the pulse width extraction control circuit are connected to a preset control signal output terminal UP of the phase frequency detector. UP in the embodiment may represent voltage signals transmitted by the preset control signal output terminal and ports connected therewith. In the phase frequency detector, by comparing the input reference clock signal fref and feedback clock signal fbk to generate control signals UP, DN, UPB and DNB, the signal UPB and the signal DN are configured to control a current switch MOS tube in the charge pump. The signal UP and the signal DNB are configured to counteract charge sharing. The signal UPB and the signal UP are a pair of opposite control signals and the signal DNB and the signal DN are further a pair of opposite control signals. In particularly, the signal DN is kept as a constant signal after a raising stage of the control voltage output by the low pass filter. Therefore, both the signal DNB and the signal DN are not suitable for regulating the current step-by-step. In the related art, the signal UPB is utilized to control a current switch apparatus of the charge pump. If the signal is configured to control the current injection switch module, the output current of the charge pump is affected. Thus, in the embodiment, the UP signal output by the preset control signal output end of the phase frequency detector is utilized to control the current injection switch module, that is, an inverted signal, configured to control the charge pump to inject the current, output by the phase frequency detector is configured to control on-off of the current injection switch module without affecting the charge pump.

As shown in FIG. 1, a signal input terminal VC_in of the low pass filter is connected with a signal output terminal of the charge pump, a capacitance input terminal VC_DN of the low pass filter is connected with a signal output terminal of the current injection switch module, it is configured to receive charges injected by the signal output terminal of the current injection switch module while receiving charges provided by the signal output terminal of the charge pump and to generate a control voltage from accumulated charges and output the control voltage to the voltage-controlled oscillator via the signal output end VC_out of the low pass filter. The capacitance input terminal VC_DN of the low pass filter is a connective node of a resistor R and a capacitor C10 connected therewith in series in a resistance-capacitance series branch in the low pass filter. The low pass filter shown in the embodiment of FIG. 1 is a second order low pass filter. The second order low pass filter includes a first filter capacitor C10, a second filter capacitor C20 and a resistor R3. The signal output terminal (VC_DN in FIG. 1) of the current injection control module is connected with one terminal of the first filter capacitor C10 and one terminal of the resistor R simultaneously, the other terminal of the filter capacitor C10 is earthed, the other terminal of the resistor R is connected with one terminal of the second filter capacitor C20, the other terminal of the second filter capacitor C20 is earthed, the connective node of the first filter capacitor C10 and the resistor R is the capacitance input terminal VC_DN of the low pass filter, the connective node of the resistor R and the second filter capacitor C20 is taken as the signal input terminal VC_in of the low pass filter, and the connective node of the resistor R and the second filter capacitor C20 is further taken as the signal output end VC_out of the low pass filter. Besides the embodiment shown in FIG. 1, for the phase-locked acceleration circuit, multi-order low pass filters such as a third order low pass filter are suitable (not shown in the figure) and it is not needed to change any loop parameters. The connective node of the filter resistor and the filter capacitor may be taken as an input terminal or an output terminal of the low pass filter and may be configured to receive charges injected by the current injection switch module and charges injected in a charging and discharging process by the charge pump. Meanwhile, its performance may be optimized according to a quick locking ability provided by the phase-locked acceleration circuit. The function of the low pass filter is to convert a pulse control signal (in form of charge and discharge by the charge pump), related to a phase error, output by the phase frequency detector into a stable control signal and filter out the noises.

It should be noted that in the phase-locked loop, a locking process of the phase-locked loop is composed of a frequency regulating stage and a phase regulating stage. The phase-locked loop starts to work, and the enabling control signal is converted from low level to high level. The enabling control terminal EN of the pulse width extraction control circuit in the embodiment is converted from low level to high level, and the phase-locked loop starts to work and enters the frequency regulating stage. Due to enabling control of the enabling signal EN, the voltage-controlled oscillator starts to generate the output clock frequency signal and feed the signal back to the phase frequency detector by the frequency divider. In the stage, the UP signal is in a long high level first. When the phase frequency detector receives the feedback signal, the control signal UP with the duty ratio changing irregularly is output by the phase relationship between the reference clock signal fref and the feedback clock signal fbk. When the signal UP is in the long high level, the control output terminal ctr_kep of the pulse width extraction control circuit is in the low level to conduct the current injection switch module, such that the charges are injected into the filter capacitor in the low pass filter to accelerate the frequency regulating process, and thus, the voltage output by the low pass filter to the voltage-controlled oscillator is raised until the voltage is approximate to or is slightly lower than the final stable voltage. The signal UP is promoted to jump the irregular change stage, and at the moment, the frequency of the feedback clock signal fbk is slightly lower than the frequency of the reference clock signal fref to enter the phase regulating stage. After entering the phase regulating stage, the signal UP is regulated by the phase frequency detector to a rectangular wave signal with duty ratio changing regularly. Its change rule is as follows: it may be known in combination with FIG. 5 and FIG. 7 that the low pulse width of the signal UP is decreased first and increased then (as the voltage output by the low pass filter to the voltage-controlled oscillator is slightly lower than the final stable voltage when the phase-locked loop of the embodiment enters the phase regulating stage via regulation, one condition is only considered) until the low pulse width of the signal UP is nearly equal to a periodical width of the signal UP.

Specifically, the change trend of the signal UP reflects the phase relationship between the feedback signal and the reference signal input by the phase frequency detector. When the low pulse width of the signal UP is decreased, it is represented that the frequency of the feedback clock signal fbk is smaller than the frequency of the reference clock signal fref. In the stage, the reference clock signal fref is ahead of the feedback clock signal fbk and the ahead pulse width of the reference clock signal fref compared with the feedback clock signal, the voltage VC, configured to control the voltage-controlled oscillator, output by the low pass filter is lower than the final stable voltage, and meanwhile, the current is charged into the capacitor corresponding to the low pass filter via the charge pump, such that the voltage of the signal output terminal VC_out of the low pass filter is increased. The frequency of the feedback clock signal fbk is further increased, such that the decreasing speed of the low pulse width of the signal UP is decreased gradually until the low pulse width of the signal UP is no longer decreased when the frequency of the feedback clock signal fbk is equal to the frequency of the reference clock signal fref, and at the time, due to the feedback delay characteristic of the phase-locked loop, the voltage of the signal output terminal VC_out of the low pass filter has been slightly higher than the final stable voltage at the moment and the phases of the feedback clock signal fbk and the reference clock signal fref are not aligned, it is still needed to conduct a phase synchronizing process. The voltage of the signal output terminal VC_out of the low pass filter is raised continuously, the frequency of the feedback clock signal fbk is greater than that of the reference clock signal fref, the low pulse width of the signal UP is controlled to increase, and at the moment, the voltage of the signal output terminal VC_out of the low pass filter surpasses the final stable voltage. Then, the signal enters a damped oscillation process until the phase is locked.

In the phase locking process, the signal enters the frequency regulating stage first. As a result of delay action of the feedback loop, the signal UP endures a long high level, and the current injection switch module is conducted to inject charges to the capacitance input terminal VC_DN quickly. The voltage of the signal output terminal VC_out is increased quickly and the voltage of the signal output terminal VC_out is approximate to the final stable voltage. Then, with approach of the feedback signal, the signal UP becomes a jump signal with regularly changing low pulse width. The frequency regulating stage is switched to the phase regulating stage, and a stage of regulating the current injection switch module step-by-step is started. The pulse width extraction control circuit is configured to jump the signal output by the control output terminal ctr_kep at a proper moment according to the change condition of the duty ratio of the output signal UP of the control signal output terminal so as to turn off injection of the charges to the capacitance input terminal VC_DN of the low pass filter.

Specifically, the pulse width extraction control circuit determines a plurality of extraction sections by delaying the enabling control terminal EN signal of the pulse width extraction control circuit, and extracts the low pulse width information of the extraction signal UP in different time phases one by one before stable phase locking, i.e., compares the sizes of the low pulse widths of the signal UP output by the control output terminal in different time phases. When the voltage of the signal output terminal VC_out of the low pass filter is approximately stable, the ctr_kep output of the control output terminal jumps to complete phase-locked acceleration, such that the speed of phase synchronization between the feedback clock signal fbk and the reference clock signal fref is improved and it is favorable for the phase-locked loop to enter the stable damped oscillation locking process. Thus, the phase-locked time can be shortened greatly, such that the phase-locked loop is locked quickly and therefore, the phase-locked time is shortened. Further, the pulse width extraction control circuit selects to start a change moment of a growth trend of the pulse width of the signal UP according to the change rule of the low pulse width of the pulse signal UP, and at the moment, the frequency of the feedback clock signal fbk is approximate to the frequency of the reference clock signal fref, such that the control output terminal ctr_kep of the pulse width extraction control circuit outputs the high level to turn off work of the phase-locked acceleration circuit, and at the moment, charge overshoot of the low pass filter is avoided by cutting off the phase-locked acceleration circuit. Compared with the related art, the embodiment is established on a basis of a pure hardware circuit. By injecting charges quickly, the voltage of the signal output terminal VC_out of the low pass filter is improved quickly; the pulse width extraction control circuit controls the current conduction state of the current injection switch module according to the jump condition of the control signal UP, reflecting the phase relationship, between the reference clock signal and the feedback clock signal. Matched with the change of the duty ratio of the signal UP, the pulse width extraction control circuit controls injection of the charges into the low pass filter step-by-step, such that the phase-locked time is shortened and meanwhile, the phase-locked acceleration circuit is turned off to prevent the loop parameters from being affected when being approximate to phase locking.

As shown in FIG. 1, the current injection switch module includes a power supply VCC, a first zero N-Metal-Oxide-Semiconductor (NMOS) tube MN10, a second zero NMOS tube MN20 and a first zero Positive-channel-Metal-Oxide-Semiconductor (PMOS) tube MP10, a source electrode of the first zero NMOS tube MN10 is connected with a drain electrode of the second zero NMOS tube MN20, a gate electrode is connected with a drain electrode of the first zero NMOS tube MN10 and the drain electrode is connected with the power supply VCC, such that the first zero NMOS tube MN10 is taken as a current limiting MOS tube; a drain electrode of the second zero NMOS tube MN20 is connected with a source electrode of the first zero NMOS tube MN10, a source electrode is connected with a source electrode of the first zero PMOS tube MP10, and a gate electrode is connected with a preset control signal output terminal UP as a current stepping input the step-by-step control terminal UP of the current injection switch module and the gate electrode of the second zero NMOS is configured to change to change the conduction condition of the second zero NMOS tube MN20 according to the jump state of the output signal UP of the preset control signal output terminal so as to realize step-by-step current injection of the current injection switch module; a source electrode of the first zero PMOS tube MP10 is connected with the source electrode of the second zero NMOS tube MN20, a gate electrode is connected with the control output terminal ctr_kep of the pulse width extraction control circuit as the current injection control terminal ctr_kep of the current injection switch module; a drain electrode is taken as a signal output terminal of the current injection switch module and is connected with the capacitance input terminal VC_DN of the low pass filter; when the signal UP is high, the second zero NMOS tube MN20 is conducted, and when the signal UP is low, the second zero NMOS tube MN20 is turned off; meanwhile, when the signal ctr_kep is high, the first zero PMOS tube MP10 is turned off, and when the signal ctr_kep is low, the first zero PMOS tube MP10 is turned off; when the second zero NMOS tube MN20 and the first PMOS tube MP10 are conducted simultaneously, the current injection switch module controls the power supply VCC to inject the current into the capacitance input terminal VC_DN of the low pass filter to accelerate change of the voltage VC_DN so as to accelerate change of the control voltage output by the low pass filter to the voltage-controlled oscillator, and otherwise, the phase-locked acceleration circuit is turned off. The current injection switch module is matched with the control signal output by the driving pulse width extraction control module thereof simultaneously by utilizing the output signal of the preset control signal output end to inject the charges quickly at the beginning and control the current injected into the low pass filter to be injected step-by-step if being approximately locked, such that voltage overshoot at the capacitance input terminal of the low pass filter is decreased. It is further ensured that the stability of the suitable phase-locked loop system is not affected.

It may be known from those skilled in the art that in the current injection switch module, a connecting structure of the first zero NMOS tube can be replaced by a current source configured to control amplitude of the current. A cathode of the current source is connected with the power supply, an anode of the current source is connected with a drain electrode (not shown in the figures) of the second zero NMOS tube, and the current source is substantially composed of the MOS tubes which play a current-limiting role as well and merely a special grid voltage is additionally set. Meanwhile, it may be directly acquired from common sense of those skilled in the art that a specific circuit of the current source may be composed of a current mirror circuit, wherein the current mirror may generate a reference current, which is not narrated herein.

As shown in FIG. 2, FIG. 3, FIG. 4 and FIG. 6, the delay control module includes a pulse extraction array, a delay level generation array and a control signal generation module, wherein the driving input terminal UP is connected with the clock input terminal arranged in the delay level generation array, and the enabling control terminal EN is connected with the data input terminal arranged in the delay level generation array; the delay level generation array internally includes (n+3) cascaded D triggers which are corresponding to (n+3) data output $Q_1$, $Q_2$, $Q_3$ ... $Q(n+3)$, wherein a D trigger connected with the enabling control terminal EN is the first level D trigger, the number of stages of the D trigger cascaded to the first D trigger is increased progressively in sequence, and correspondingly, the number of stages of the cascaded pulse width extraction unit is equal to a smaller stage of two adjacent cascaded D triggers connected with the cascaded pulse width extraction unit. When some pulse width extraction unit is connected with the data output end $Q_1$ of the first D trigger and the data output end $Q_2$ of the second D trigger, the pulse width extraction unit is the first pulse width extraction unit in the pulse width extraction array. The pulse width extraction array internally includes n cascaded pulse width extraction units, each of the pulse width extraction units is provided with two pulse input terminals, one charge discharge control terminal, one driving terminal and one pulse width information output terminal; the adjacent cascaded pulse width extraction units share a common pulse input terminal, and are connected with the same D trigger. The stage of the D trigger is equal to that of the next pulse width extraction unit in the adjacent cascaded pulse width extraction units. The driving terminals of the (n+2) cascaded pulse width extraction units are connected with a clock input terminal UP arranged in the delay level generation array. The data output terminals of the two adjacent cascaded D triggers in the delay level generation array are correspondingly connected to two pulse input terminals of the pulse width extraction unit with matched stage number in the pulse width extraction arrays, for example, the data output terminal $Q_2$ of the second D trigger and the data output terminal $Q_3$ of the third D trigger are connected to the two pulse input terminals of the second pulse width extraction unit. In the delay level generation array, the inverting output terminal QIB of the D trigger connected with the enabling control terminal is connected with the charge discharge control terminal of each pulse width extraction unit. The control signal generation module includes n comparators, a non-inverting input terminal and a inverting input terminal of each of then comparators are respectively connected with the pulse width information output terminals of the two adjacent cascaded pulse width extraction unit respectively, and the non-inverting input terminal of one of the comparators is connected with the pulse width information output terminal V(n+2) of the (n+2)-th pulse width extraction unit. The inverting input terminal of the comparator is connected with the pulse width information output terminal V(n+1) of the (n+1)-th (n is greater than 1) pulse width extraction unit; there is only one input terminal of the adjacent two comparators is connected with the pulse width information output terminal of one pulse width extraction unit, the inverting input terminal of the first comparator is connected with the pulse width information output terminal $V_2$ of the second pulse width extraction unit, the non-inverting input terminal of the first comparator is connected with the pulse width information output terminal $V_3$ of the third pulse width extraction unit, the inverting input terminal of the second comparator is connected with the pulse width information output terminal $V_3$ of the third pulse width extraction unit, the non-inverting input terminal of the second comparator is connected with the pulse width information output terminal $V_4$ of the fourth pulse width extraction unit, the inverting input terminal of the third comparator is connected with the pulse width information output terminal $V_4$ of the fourth pulse width extraction unit, and the non-inverting input terminal of the third comparator is connected with the pulse width information output terminal $V_5$ of the fifth pulse width extraction unit, and therefore, the input terminals of the two adjacent comparators connected with the pulse width information output terminal of one pulse width extraction unit are different in attribute, and the input terminals of the two non-adjacent comparators are not connected with the pulse width information output terminal of one pulse width extraction unit. According to the embodiment, the enabling control signal EN output by the enabling control terminal is sent to the delay level generation array first to conduct delay processing to obtain (n+3) delay levels, then a conduction condition of the pulse width extraction unit of the corresponding level in the pulse width extraction array is controlled by means of every two adjacent level delay output signals to extract and convert the low pulse width in each period output by the driving input terminal into voltage information which is stored in the capacitor of the pulse width extraction unit, and then voltage values representing the pulse width information output by the pulse width extraction unit are compared by the comparators in the control signal generation module to determine the condition that the current injection switch module injects charges into the low pass filter, such that the injected current is cut-off at a proper moment, the voltage overshoot condition at the capacitance input terminal is reduced and the phase locked time is shortened; furthermore, proper stage numbers expansion and circuit parameter regulation are conducted according to a logic relationship of the circuit to obtain a more precise control effect. In the stage numbers expansion process, the complexity of the circuit is not improved obviously as the circuit is simple in structure and easy to integrate.

Figure 4:
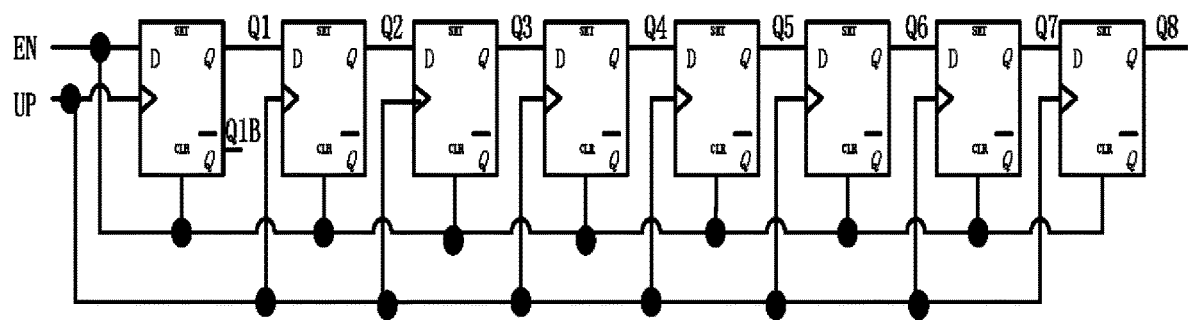
FIG. 4 is a structural schematic diagram of a delay level generation array applied to a pulse width extraction control circuit shown in FIG. 2.
Figure 5:
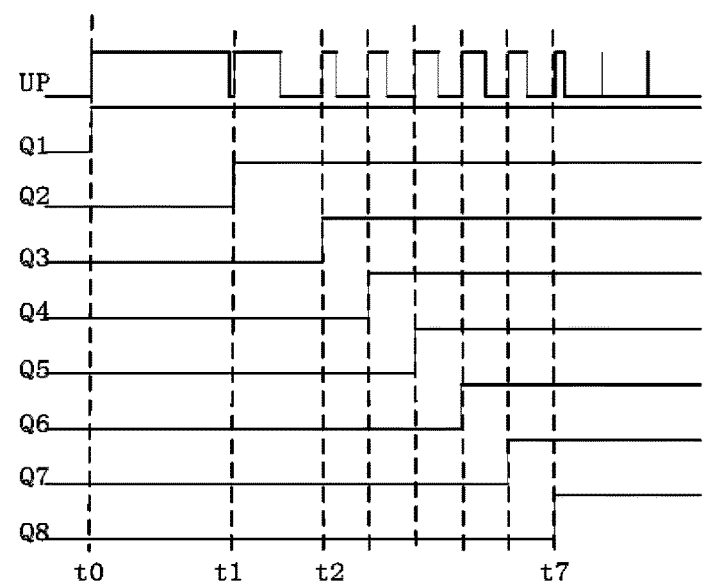
FIG. 5 is an oscillogram of an output signal of each D trigger of a delay level generation array in FIG. 4 changing along with an input control signal UP.

As an embodiment, in the delay level generation array, n is preferably 5, and the delay level generation array is formed by cascading eight D triggers. As shown in FIG. 4, a connecting structure thereof is structured such that the data input terminal D of the first D trigger is connected with the enabling control terminal EN; in two adjacent cascaded D triggers, a data input terminal D of the next D trigger is connected with the data output terminal Q of a previous D trigger and is correspondingly provided with eight data output terminals $Q_1$, $Q_2$, $Q_3$, $Q_4$, $Q_5$, $Q_6$, $Q_7$ and $Q_8$; and a clock terminal of each D trigger is connected with the driving input terminal UP, and a reset end CLR of each D trigger is connected with the enabling control terminal EN. The signal EN is turned from low level to high level, which marks a new round phase locking work by the phase-locked loop. As shown in FIG. 5, the signal UP generates a first rising edge at a moment t0, and the output end $Q_1$ of the first D trigger inputs the signal EN, such that the output signal $Q_1$ is turned into high level. As a result of delay of the first D trigger, the second D trigger is in the low level when the first rising edge of the signal UP arrives until the output terminal $Q_2$ of the second D trigger at the moment t1 is still low level, the signal UP between t0 and t1 is kept in the high level state in a long time period, the output terminals $Q_3$, $Q_4$, $Q_5$, $Q_6$, $Q_7$ and $Q_8$ of the D trigger with higher subsequent stage number are kept in low level, and when the signal UP in the t0 to t1 time period is turned into low level, the output signals of the cascaded D triggers do not change but may be configured to conduct the first zero PMOS tube MP10 of the current injection switch module to inject the charges into the capacitance input terminal VC_DN of the low pass filter via the first zero NMOS tube MN10 and the second zero NMOS tube MN20 so as to accelerate a frequency modulating process of the phase-locked loop. At the moment t1, a second rising edge of the signal UP arrives. The output terminal $Q_1$ of the first D trigger is still high level and does not change, and the output terminal $Q_2$ of the second D trigger receives the high level of the output terminal $Q_1$ of the first D trigger. As being affected by delay, when the second rising edge of the signal UP arrives, the input terminal $Q_2$ of the third D trigger is low level, such that the output terminal of the third D trigger is low level until a third rising edge of the UP signal at the moment t2 arrives, wherein, the signal UP in the time period t0 to t2 changes irregularly and is in the frequency modulating stage. According to the same principle, whenever the next rising edge of the signal UP arrives, the output of the next D trigger is turned into high level, such that a delay level is generated till the moment t7. By changing a capacitance relationship in the pulse width extraction array in the embodiment, change of the control signal at the latest moment t7 is set, such that the stability is guaranteed. Then, the signal UP is low level and high level pulses, and the low pulse width of the signal UP is approximately equal to a period of the signal UP. In the phase regulating stage from the moment t2 to the moment t7, the low pulse width of the signal UP is decreased first and then increased, and after the moment t7, the phase-locked loop system enters the small amplitude damped oscillation and phase-locked stable state.

Figure 3:
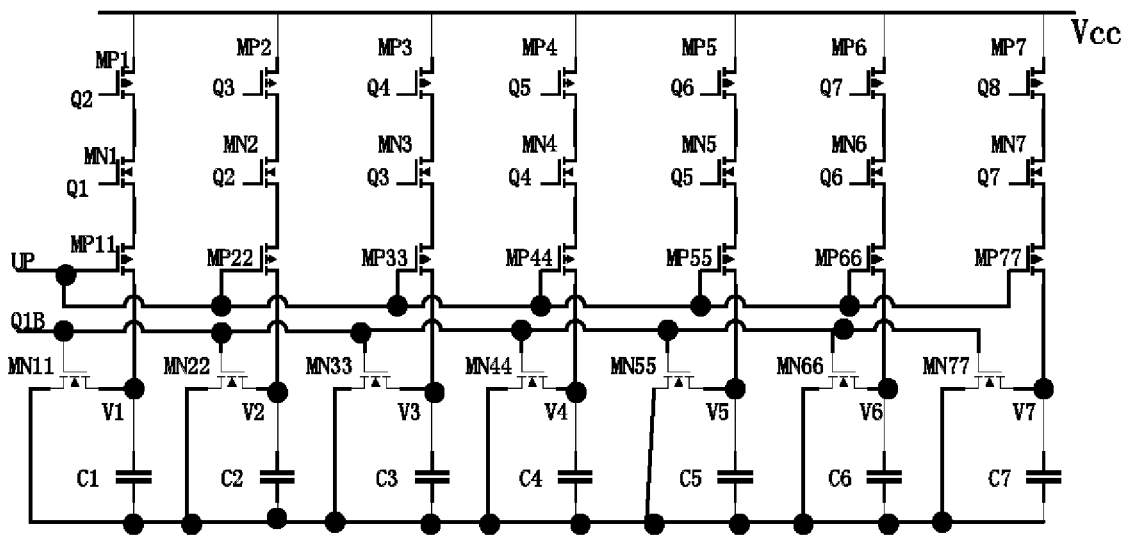
FIG. 3 is a structural schematic diagram of a pulse width extraction array applied to a pulse width extraction control circuit shown in FIG. 2.

The pulse width extraction array includes a power supply VCC and (n+2) cascaded pulse width extraction units. Based on the embodiment, n is preferably 5. As shown in FIG. 3, each of the cascaded pulse width extraction units includes a pulse width testing NMOS tube MN1, a pulse width testing PMOS tube MP1, a first switching PMOS tube MP11, a first reset control NMOS tube MN11 and a first capacitor $C_1$. The gate electrode of the first pulse width testing NMOS tube MN1 is connected with the data output terminal $Q_1$ of the first D trigger in the delay level generation array, the gate electrode of the first pulse width testing PMOS tube MP1 is connected with the data output terminal $Q_2$ of the second D trigger in the delay level generation array, the second D trigger and the first D trigger are in an adjacent cascaded connecting relationship to meet a condition that data output terminals of the two adjacent cascaded D triggers in the delay level generation array are correspondingly connected to two pulse input terminals of the pulse width extraction units with matched stage number in the pulse width extraction array, wherein the gate electrode of the first pulse width testing NMOS tube MN1 and the gate electrode of the first pulse width testing PMOS tube MP1 are respectively taken as the two pulse input terminals; a source electrode of the first pulse width testing PMOS tube MP1 is connected with the power supply VCC, a drain electrode of a first pulse width testing PMOS tube MP1 is connected with a first drain electrode of the pulse width testing NMOS tube MN1, the source electrode of a first pulse width testing NMOS tube MN1 is connected with a source electrode of the first switching PMOS tube MP11, a gate electrode of the first switching PMOS tube MP11 is taken as the driving terminal UP of the pulse width extraction unit, a gate electrode of the first reset control NMOS tube MN11 is taken as the charge discharge control terminal QIB, a drain electrode of the reset control NMOS tube MN11 is connected with a drain electrode of the first switching PMOS tube MP11 and an upper plate of the first capacitor $C_1$, a connective node $V_1$ of the drain electrode of the first reset control NMOS tube MN1 and the upper plate of the capacitor $C_1$ is taken as the pulse width information output terminal, and a lower plate of the capacitor $C_1$ and a source electrode of the first reset control NMOS tube MN1 are earthed.

As shown in FIG. 3, the second pulse width extraction unit includes a second pulse width testing NMOS tube MN2, a second pulse width testing PMOS tube MP2, a second switching PMOS MP22, a second reset control NMOS tube MN22 and a second capacitor $C_2$, the gate electrode of the second pulse width testing NMOS tube MN2 is connected with the data output terminal $Q_2$ of the second D trigger in the delay level generation array, the gate electrode of the second pulse width testing PMOS tube MP2 is connected with the data output terminal $Q_3$ of the third D trigger in the delay level generation array, and the source electrode of the second pulse width testing PMOS tube MP2 is connected with the power supply VCC. The drain electrode of the second pulse width testing PMOS tube is connected with the drain electrode of the second pulse width testing NMOS tube, the source electrode of the second pulse width testing NMOS tube is connected with the source electrode of the second switching PMOS tube MP22, the gate electrode of the second switching PMOS tube MP22 is taken as the driving terminal UP of the pulse width extraction unit, the gate electrode of the second reset control NMOS tube MN22 is taken as the charge discharge control terminal QIB, the drain electrode of the second reset control NMOS tube MN22 is connected to the drain electrode of the second switching PMOS tube MP22 and the upper plate of the second capacitor $C_2$ simultaneously, the connective node $V_2$ of the second reset control NMOS tube MN22 and the upper plate of the second capacitor $C_2$ is taken as the pulse width information output terminal and both the lower plate of the second capacitor $C_2$ and the source electrode of the second reset control NMOS tube MN22 are earthed.

In a similar way, as shown in FIG. 3, the third pulse width extraction unit includes a third pulse width testing NMOS tube MN3, a third pulse width testing PMOS tube MP3, a third switching PMOS tube MP33, a third reset control NMOS tube MN33 and a third capacitor $C_3$. The gate electrode of the third pulse width testing NMOS tube MN3 is connected with the data output terminal $Q_3$ of the third D trigger in the delay level generation array, the gate electrode of the third pulse width testing PMOS tube MP3 is connected with the data output terminal $Q_4$ of the fourth D trigger in the delay level generation array, the source electrode of the third pulse width testing NMOS tube MN3 is connected with the power supply VCC, the drain electrode of the third pulse width testing PMOS tube MP3 is connected with the drain electrode of the third pulse width testing NMOS tube MN3, the source electrode of the third pulse width testing NMOS tube MN3 is connected with source electrode of the third switching PMOS tube MP33, the gate electrode of the third switching PMOS tube MP33 is taken as the driving terminal UP of the pulse width extraction unit, the gate electrode of the third reset control NMOS tube MN33 is taken as the charge discharge control terminal QIB, the drain electrode of the third reset control NMOS tube MN33 is connected with the drain electrode of the third pulse width testing PMOS tube MP3 and the upper plate of the third capacitor $C_3$ simultaneously, the connective node $V_3$ of the drain electrode of the third pulse width testing NMOS tube MN3 and the upper plate of the third capacitor $C_3$ is taken as the pulse width information output terminal, and both the lower plate of the third capacitor $C_3$ and the source electrode of the third reset control NMOS tube MN33 are earthed. The gate electrodes of the switching PMOS tubes of all the cascaded pulse width extraction units are connected to the clock input terminal, the gate electrodes of the reset control NMOS tubes of all the cascaded pulse width extraction units are connected to one node, and the node is the inverting output terminal QIB of the first D trigger.

As shown in FIG. 3, the fourth pulse width extraction unit includes a fourth pulse width testing NMOS tube MN4, a fourth pulse width testing PMOS tube MP4, a fourth switching PMOS tube MP4, a fourth reset control NMOS tube MN44 and a fourth capacitor $C_4$. The gate electrode of the fourth pulse width testing NMOS tube MN4 is connected with the data output terminal $Q_4$ of the fourth D trigger in the delay level generation array, the gate electrode of the fourth pulse width testing PMOS tube MP4 is connected with the data output terminal $Q_5$ of the fifth D trigger in the delay level generation array, the source electrode of the fourth pulse width testing PMOS tube PN4 is connected with the power supply VCC, the drain electrode of the fourth pulse width testing PMOS tube MP4 is connected with the drain electrode of the fourth pulse width testing NMOS tube MN4, the source electrode of the fourth pulse width testing NMOS tube MN4 is connected with the source electrode of the fourth switching PMOS tube MP44, the gate electrode of the fourth switching PMOS tube MP44 is taken as the driving terminal UP of the pulse width extraction unit, the gate electrode of the fourth reset control NMOS tube MP44 is taken as the charge discharge control terminal QIB, the drain electrode of the fourth reset control NMOS tube MN44 is connected with the drain electrode of the fourth pulse width testing PMOS tube MP4 and the upper plate of the third capacitor $C_4$ simultaneously, the connective node $V_4$ of the drain electrode of the fourth pulse width testing NMOS tube MN4 and the upper plate of the fourth capacitor $C_4$ is taken as the pulse width information output terminal, and both the lower plate of the third capacitor $C_4$ and the source electrode of the fourth reset control NMOS tube MN44 are earthed.

As shown in FIG. 3, the fifth pulse width extraction unit includes a fifth pulse width testing NMOS tube MN5, a fifth pulse width testing PMOS tube MP5, a fifth switching PMOS tube MP5, a fifth reset control NMOS tube MN55 and a fifth capacitor $C_5$. The gate electrode of the fifth pulse width testing NMOS tube MN5 is connected with the data output terminal $Q_5$ of the fourth D trigger in the delay level generation array, the gate electrode of the fifth pulse width testing PMOS tube MP5 is connected with the data output terminal $Q_6$ of the sixth D trigger in the delay level generation array, the source electrode of the fifth pulse width testing PMOS tube PN5 is connected with the power supply VCC, the drain electrode of the fifth pulse width testing PMOS tube MP5 is connected with the drain electrode of the fifth pulse width testing NMOS tube MN5, the source electrode of the fifth pulse width testing NMOS tube MN5 is connected with the source electrode of the fifth switching PMOS tube MP55, the gate electrode of the fifth switching PMOS tube MP55 is taken as the driving terminal UP of the pulse width extraction unit, the gate electrode of the fifth reset control NMOS tube MN55 is taken as the charge discharge control terminal QIB, the drain electrode of the fifth reset control NMOS tube MN55 is connected with the drain electrode of the fifth pulse width testing PMOS tube MP5 and the upper plate of the fifth capacitor $C_5$ simultaneously, the connective node $V_5$ of the drain electrode of the fifth pulse width testing NMOS tube MN5 and the upper plate of the fifth capacitor $C_5$ is taken as the pulse width information output terminal, and both the lower plate of the third capacitor $C_5$ and the source electrode of the fifth reset control NMOS tube MN55 are earthed.

As shown in FIG. 3, the sixth pulse width extraction unit includes a sixth pulse width testing NMOS tube MN6, a sixth pulse width testing PMOS tube MP6, a sixth switching PMOS tube MP6, a sixth reset control NMOS tube MN66 and a sixth capacitor $C_6$. The gate electrode of the sixth pulse width testing NMOS tube MN6 is connected with the data output terminal $Q_6$ of the sixth D trigger in the delay level generation array, the gate electrode of the sixth pulse width testing PMOS tube MP6 is connected with the data output terminal $Q_7$ of the seventh D trigger in the delay level generation array, the source electrode of the sixth pulse width testing PMOS tube PN6 is connected with the power supply VCC, the drain electrode of the sixth pulse width testing PMOS tube MP6 is connected with the drain electrode of the sixth pulse width testing NMOS tube MN6, the source electrode of the sixth pulse width testing NMOS tube MN6 is connected with the source electrode of the sixth switching PMOS tube MP66, the gate electrode of the sixth switching PMOS tube MP66 is taken as the driving terminal UP of the pulse width extraction unit, the gate electrode of the sixth reset control NMOS tube MN66 is taken as the charge discharge control terminal QIB, the drain electrode of the sixth reset control NMOS tube MN66 is connected with the drain electrode of the sixth pulse width testing PMOS tube MP6 and the upper plate of the sixth capacitor $C_6$ simultaneously, the connective node $V_6$ of the drain electrode of the sixth pulse width testing NMOS tube MN6 and the upper plate of the sixth capacitor $C_6$ is taken as the pulse width information output terminal, and both the lower plate of the sixth capacitor $C_6$ and the source electrode of the sixth reset control NMOS tube MN66 are earthed.

As shown in FIG. 3, the seventh pulse width extraction unit includes a seventh pulse width testing NMOS tube MN7, a seventh pulse width testing PMOS tube MP7, a seventh switching PMOS tube MP7, a seventh reset control NMOS tube MN77 and a seventh capacitor $C_7$. The gate electrode of the seventh pulse width testing NMOS tube MN7 is connected with the data output terminal $Q_7$ of the seventh D trigger in the delay level generation array, the gate electrode of the seventh pulse width testing PMOS tube MP7 is connected with the data output terminal $Q_8$ of the eighth D trigger in the delay level generation array, the source electrode of the seventh pulse width testing PMOS tube PN7 is connected with the power supply VCC, the drain electrode of the seventh pulse width testing PMOS tube MP7 is connected with the drain electrode of the seventh pulse width testing NMOS tube MN7, the source electrode of the seventh pulse width testing NMOS tube MN7 is connected with the source electrode of the seventh switching PMOS tube MP77, the gate electrode of the seventh switching PMOS tube MP77 is taken as the driving terminal UP of the pulse width extraction unit, the gate electrode of the seventh reset control NMOS tube MN77 is taken as the charge discharge control terminal QIB, the drain electrode of the seventh reset control NMOS tube MN77 is connected with the drain electrode of the seventh pulse width testing PMOS tube MP7 and the upper plate of the seventh capacitor $C_7$ simultaneously, the connective node $V_7$ of the drain electrode of the seventh pulse width testing NMOS tube MN7 and the upper plate of the seventh capacitor $C_7$ is taken as the pulse width information output terminal, and both the lower plate of the seventh capacitor $C_7$ and the source electrode of the seventh reset control NMOS tube MN77 are earthed.

It may be known in combination with FIG. 3 that according to a gate control mode of the first pulse width testing NMOS tube MN1 and the first pulse width testing PMOS tube MP1, only when the data output terminal $Q_1$ of the first D trigger is high level and the data output terminal $Q_2$ of the second D trigger is low level, can the charged be injected into the first capacitor $C_1$. It may be known from FIG. 5 that the time period t0 to t1 meets the state, and meanwhile, the gate electrode of the first switching PMOS tube MP11 is controlled by the UP signal, in the time interval where both the first pulse width testing NMOS tube MN1 and the first pulse width testing PMOS tube MP1 are conducted, only when the signal UP is low level, the charges can be injected into the first capacitor $C_1$, and the amplitudes of voltages carried at two terminals of the first capacitor $C_1$ and the times of injecting the charges are in direct proportion, such that a function of extracting first low pulse width information of the signal UP; in a similar way, when the output of the output terminal $Q_2$ of the second D trigger is high level and the data output terminal $Q_3$ of the third D trigger is low level, i.e., the time interval from t1 to t2 in FIG. 5 is taken as a second extraction interval. When the UP signal is kept in low level in the interval, the charges can be injected into the second capacitor $C_2$, and the amplitudes of voltages carried at two terminals of the second capacitor $C_2$ and the times of injecting the charges are in direct proportion, such that a function of extracting second low pulse width information of the signal UP; in a similar way, when the output of the output terminal $Q_n$ of the n-th D trigger is high level, the data output terminal of the (n+1)-th D trigger is Q(n+1) and the signal UP is low level, subsequent pulse width extraction units extract corresponding pulse width information in corresponding extraction intervals and convert the same into voltage information which is output respectively by the pulse width information output terminals $V_1$, $V_2$, $V_3$, $V_4$, $V_5$, $V_6$ and $V_7$ by the pulse width extraction units. When the signal EN is turned into high level from low level, the data output terminal $Q_1$ of the first D trigger outputs low level, and the inverting output terminal QIB thereof outputs high level, such that the reset control NMOS tubes in the pulse width extraction units are conducted, and therefore, charges on the capacitor are released, and it is ensured that the voltage extraction from $V_1$ to $V_7$ is not affected. When the data output terminal $Q_1$ of the first D trigger outputs low level which is turned into high level, the inverting output terminal QIB thereof outputs high level, such that the charge release process is finished until the phase-locked loop is re-started next time. According to the embodiment, corresponding low pulse width information corresponding to an extraction section of each pulse width extraction unit is determined and is stored in the capacitor of the corresponding pulse width extraction unit according to a delay signal output by each adjacent cascaded D trigger in the delay level generation array, such that the relationship of amplitude of voltages of each capacitor is regulated by changing a capacitance ratio of the adjacent two pulse width extraction units, and therefore, and thus, the pulse width extraction control module controls a moment when the current injection switch module switches on and off current, the phase-locked time increase caused by loop delay of phase-locked loop can be counteracted, such that the control voltage output by the low pass filter tends to be stable and the locking time of the phase-locked loop is shortened.

It should be noted that in the 7 cascaded pulse width extraction units, a ratio between capacitances of the adjacent two cascaded pulse width extraction units is a preset numerical value which is smaller than 1. A capacitance relationship meets a condition: $C_n * K - C_{n+1}$ (n is the stage number). The K value is determined according to an actual working state of the specific phase-locked ring and is about 0.8-1, and K in the embodiment is preferably 0.9. According to the embodiment, it is favorable to control the current injection switch module to turn off injection of charges to the capacitance terminal of the low pass filter under a condition of compensating increase of the phase-locked time due to delay of the feedback loop. The MOS tubes playing the same roles in the pulse width extraction units are same in parameter, to ensure that the pulse width information is extracted accurately.

Figure 6:
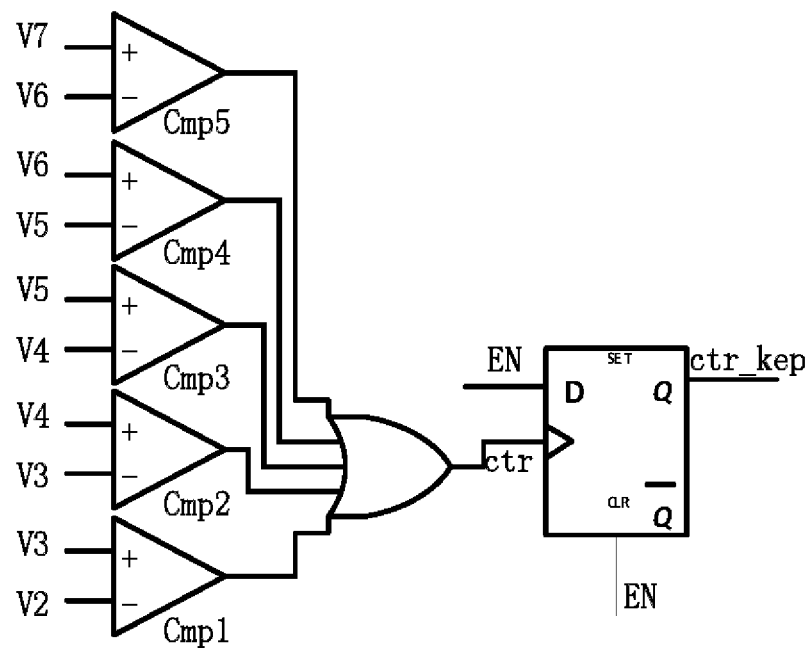
FIG. 6 is a structural schematic diagram of a control signal generation module applied to a pulse width extraction control circuit shown in FIG. 2 provided by an embodiment of the present disclosure.

The control signal generation module includes n comparators, an or-logic circuit and a switching D trigger. The non-inverting input terminal and the inverting input terminal of each of the n comparators are respectively connected with the pulse width information output terminals of the two adjacent cascaded pulse width extraction unit respectively from a second stage pulse width extraction unit according to a cascading sequence in the pulse width extraction array, the inverting input terminal of the comparator is connected with the pulse width information output terminal of the pulse width extraction unit with the smaller stage, and the non-inverting input terminal of the comparator is connected with the pulse width information output terminal of the pulse width extraction unit with the greater stage. The or-logic circuit includes a plurality of or gates or corresponding combinational logic circuits. As shown in FIG. 6, the control signal generation module includes five comparators, one five-input or gates and a switching D triggers, wherein the negative input terminal of the comparator cmp1 is connected with a pulse width information output terminal $V_2$ of the second pulse width extraction unit and the positive input terminal thereof is connected with the pulse width information output terminal $V_3$ of the third pulse width extraction unit; the negative input terminal of the comparator cmp2 is connected with a pulse width information output terminal $V_3$ of the third pulse width extraction unit and the positive input terminal thereof is connected with the pulse width information output terminal $V_4$ of the fourth pulse width extraction unit; the negative input terminal of the comparator cmp3 is connected with a pulse width information output terminal $V_4$ of the fourth pulse width extraction unit and the positive input terminal thereof is connected with the pulse width information output terminal $V_4$ of the fifth pulse width extraction unit; the negative input terminal of the comparator cmp4 is connected with a pulse width information output terminal $V_5$ of the fifth pulse width extraction unit and the positive input terminal thereof is connected with the pulse width information output terminal $V_6$ of the sixth pulse width extraction unit; the negative input terminal of the comparator cmp5 is connected with a pulse width information output terminal $V_6$ of the sixth pulse width extraction unit and the positive input terminal thereof is connected with the pulse width information output terminal $V_7$ of the seventh pulse width extraction unit; the output terminals of the comparators cmp1, cmp2, cmp3, cmp4 and cmp5 are connected with the input terminal of the five-input or gate, the output terminal ctr of the five-input or gate is connected with the clock terminal of the switching D trigger, both the data input terminal D and the reset terminal CLR are connected with the enabling control terminal EN, and the data output terminal Q of the switching D trigger is taken as the control output terminal ctr_kep of the pulse width extraction control circuit.

Figure 7:
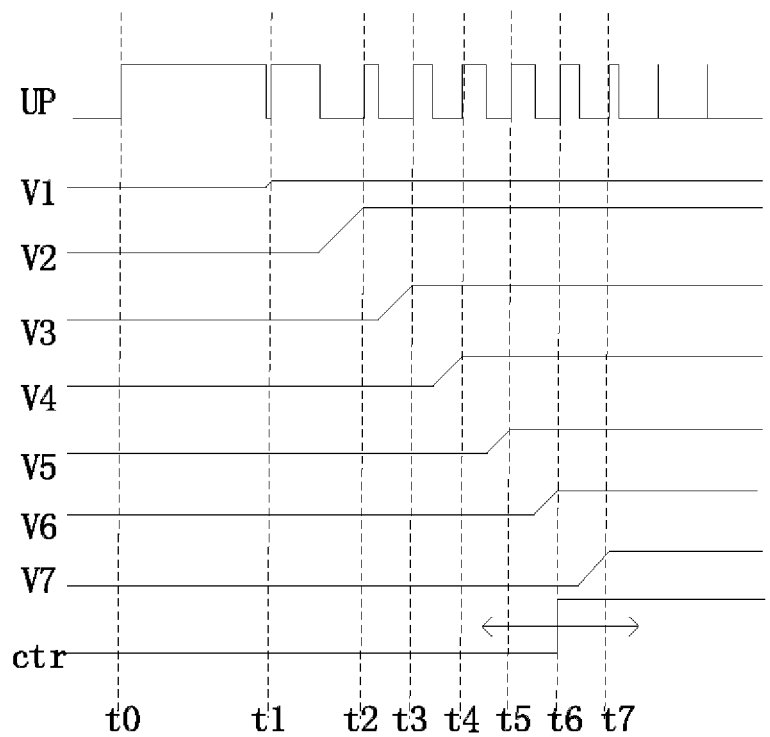
FIG. 7 is an oscillogram of an or-logic result ctr of an input signal of an input terminal of each comparator and output signals of all comparators of a control signal generation module in FIG. 6 changing along with an input control signal UP.

The control signal generation module plays a role of turning off and outputting the control signal at a proper moment as the comparators compare the voltage value relationship among $V_2$, $V_3$, $V_4$, $V_5$, $V_6$ and $V_7$. The proportion of the MOS tubes in the comparators cmp1, cmp2, cmp3, cmp4 and cmp5 in the embodiment is regulated. As shown in FIG. 7, prior to the first rising edge of the signal UP, i.e., prior to the moment t0, outputs are zero when positive and negative inputs of the comparators are zero, such that when the phase-locked loop starts to work, outputs of the normal phase and inverting input terminals of the comparators are zero, that is, $V_1$, $V_2$, $V_3$, $V_4$, $V_5$, $V_6$ and $V_7$ are zero and outputs of the comparators area zero. The moment t1 is the moment when the second rising edge of the signal UP arrives. As the low pulse width extraction voltage $V_1$ of the first pulse width extraction unit is in a transition area of the frequency regulating stage and the phase regulating stage, in the transition area, the pulse width information is not sent to the comparators of the control signal generation module to be compared as the low pulse width of the signal UP, reflecting the phase relationship between the feedback clock signal fbk and the reference clock signal fref, is unstable.

It should be noted that when there are output signals which are high level in the comparators cmp1, cmp2, cmp3, cmp4 and cmp5, the output terminal ctr of the five-input or gate is high level and otherwise, the output terminal ctr of the five-input or gate is low level. As shown in FIG. 7, the voltage $V_2$ in the time phase of t1 to t2 is raised, and the voltage $V_3$ is kept in low level. As the negative input terminal of the comparator cmp1 is connected with $V_2$ and the positive input terminal of the comparator cmp1 is connected with $V_3$, the output signal of the comparator cmp1 is zero. Upon arrival of the fourth rising edge of the signal UP, the voltage $V_3$ in the time phase from t2 to t3 is raised, but the voltage $V_2$ is still greater than the voltage $V_3$. Thus, the output of the comparator cmp1 is still zero, the output terminal ctr of the five-input or gate is still low level, which means the low pulse width of the signal UP is kept in a terminal of being decreased in the time phase from t1 to t3. If the voltage $V_2$ is smaller than the voltage $V_3$, the output of the comparator cmp1 is high level, and the output terminal ctr of the five-input or gate is turned into high level, which means the low pulse width of the signal UP in the time phase from t1 to t3 is in an increased trend integrally (not shown in FIG. 7). In the time phase from t2 to t3, the negative input terminal of the comparator cmp2 is the voltage $V_3$ started to raise, and the voltage $V_4$ accessed to the positive input terminal of the comparator cmp2 is still kept at zero, such that the output of the comparator cmp2 is zero. Upon arrival of the fifth rising edge of the signal UP, the voltage $V_4$ is raised at the moment t4, and the comparator cmp2 compares the voltage $V_3$ with the voltage $V_4$ according to a method of the embodiment so as to judge whether the low pulse width of the signal UP in the time phase from t2 to t4 is increased or decreased or not. In a similar way, the comparators cmp3, cmp4 and cmp5 compare outputs according to the principle to obtain the output signal ctr of the five-input or gate.

It should be noted that when the output of the comparator cmp2 is turned into high level, it is necessary to ensure that the output of the control signal generation module is high level, the comparators cmp3, cmp4 and cmp5 further compare outputs continuously based on the voltage signal obtained by delay without affecting the output result of the control signal generation module. Under conditions of different processes and the like, the comparators are different in performance, such that the outputs of the comparators generate oscillation and thus, the output terminal ctr of the five-input or gate generates oscillation or due to long-time work, the voltage released by the pulse width information output terminal of the pulse width extraction unit is changed as a result of leakage of charges in the capacitor of the pulse width extraction unit, such that the outputs of the comparators are changed to lead to change of the output terminal signal ctr of the five-input or gate. Thus, it is necessary to connect the output terminal of the five-input or gate to the clock terminal of the switching D trigger. The data input terminal D of the switching D trigger is connected with the EN signal. After work of the phase-locked loop, upon arrival of the first rising edge of the output terminal signal ctr of the five-input or gate, the output terminal of the switching D trigger is turned into high level from low level, and in the subsequent working process, even if the clock terminal of the switching D trigger still has rising edge to arrive, the signal ctr_kep output by the data output terminal Q of the switching D trigger is not changed and is still high level as the signal EN connected to the data input terminal D of the switching D trigger is kept unchanged in high level, such that it is ensured that the data output terminal of the switching D trigger is kept unchanged in the level state of the data input terminal under the condition that the pulse width information output terminals outputs an edge jump signal, and therefore, the reliability of the phase-locked acceleration circuit is improved.

In conclusion, the pulse width extraction array extracts the low pulse width information of the signal UP in seven different time phases. By converting the capacitance inside into the voltage values $V_1$ to $V_7$, the time of conducting the current injection switch module and the moment (the state of stable phase lock is determined) of synchronizing the phases of the reference clock signal fref and the feedback clock signal fbk input by the phase frequency detector are judged according to the low pulse width change information of the signal UP, and a reliable signal ctr_kep is sent by the control signal generation module to control the current injection switch module. As shown in FIG. 7, before the moment t5, the signal ctr is kept in low level, which illustrates that the results of the pulse width information output terminals of the adjacent cascaded pulse width extraction units compared by the comparators cmp1, cmp2 and cmp3 are zero; in the adjacent cascaded pulse width extraction units, the voltage V(n+1) of the pulse width information output terminal of the pulse width extraction unit with greater stage number is not greater than the pulse width information output terminal $V_n$ of the pulse width extraction unit with smaller stage number, such that it is not enough to overturn the control signal ctr to high level, which shows the low pulse width change state of the signal UP is still in the decreased stage. After the voltage $V_6$ is raised from the low level in the time phase from t5 to t6, the voltage $V_6$ is greater than the voltage $V_5$, the output of the comparator cmp4 is high level, the output of the output terminal signal ctr of the five-input or gate is high level, after the low pulse width of the signal UP is increased continuously until the reference clock signal fref is equal to the feedback clock signal fbk, i.e., the moment t7, the low pulse width of the signal UP is approximate to a periodical length of the signal UP in the time phase. In the future, the reference clock signal fref and the feedback clock signal fbk are regulated based on the feedback delay characteristic of phase-locked loop until the phases of the two start to change synchronously. Then, the low pass filter is configured to control the control voltage of the voltage-controlled oscillator is tend to be stable rather than to be increased, such that injection of the charges by the current injection switch module to the capacitance terminal VC_DN of the low pass filter is turned off by the signal ctr_kep. It should be noted that the current injection switch module not only is controlled by the signal ctr_kep, but also considers the level condition of the signal UP. In the low level stage of the signal ctr_kep, the first zero PMOS tube MP10 of the current injection switch module is conducted, and it is further necessary to consider whether the signal UP connected to the gate electrode of the second zero NMOS tube MN20 of the current injection switch module is high level or not. Although the first zero PMOS tube MP10 is conducted, the signal UP input by the gate electrode of the second zero NMOS tube MN20 is low level. The current injection switch module still may not inject the charges into the capacitance terminal VC_DN of the low pass filter, the current injection switch module is in the phase regulating stage, and the current is injected step-by-step under control of the signal UP. When the signal ctr_kep output by the data output terminal of the switching D trigger is high level, the switching state of the second zero NMOS tube MN20 does not affect the low pass filter. When the phase-locked loop is re-started, the output of the switching D trigger is returned to low level again until the signal ctr is turned into high level again by resetting the switching D trigger.

According to the embodiment, a time of turning off the current injection switch module by the control signal ctr is changed by changing the proportion relationship among the first capacitor $C_1$, the second capacitor $C_2$, the third capacitor $C_3$, the fourth capacitor $C_4$, the fifth capacitor $C_5$, the sixth capacitor $C_6$ and the seventh capacitor $C_7$. The current injection switch module may be controlled to be turned off in advance by decreasing the proportion parameter K and the current injection switch module may be controlled to be turned off in a delayed manner by increasing the proportion parameter K, such that the moment when the signal ctr_kep output by the control signal generation module is turned into high level is regulated finely by changing the value K, increase of the phase-locked time due to delay fed back by the phase-locked loop can be counteracted, such that the error between VC when the phase-locked acceleration circuit is turned off and the VC when the phase-locked acceleration circuit is stable finally is small as far as possible, and therefore, the locking time is small as far as possible. The capacitance relationship meets a condition: $C_n * K - C_{n+1}$ (n is the stage number). The K value is determined according to an actual working state of the specific phase-locked ring and is about 0.8-1, and K in the embodiment is preferably 0.9. As shown in FIG. 7, the capacitance ratio between the seventh capacitor $C_7$ and the sixth capacitor $C_6$ may be regulated independently to ensure turn off of the current injection switch module when the signal ctr_kep output by the control signal generation module is fixed to the moment t7, such that the stability of the phase-locked acceleration circuit is guaranteed. According to the embodiment, the time of turning of the current injection switch module by the delay control module to be advanced by decreasing the proportion coefficient K among the capacitors, such that increase of the phase-locked time due to delay fed back by the phase-locked loop is counteracted.

Figure 8:
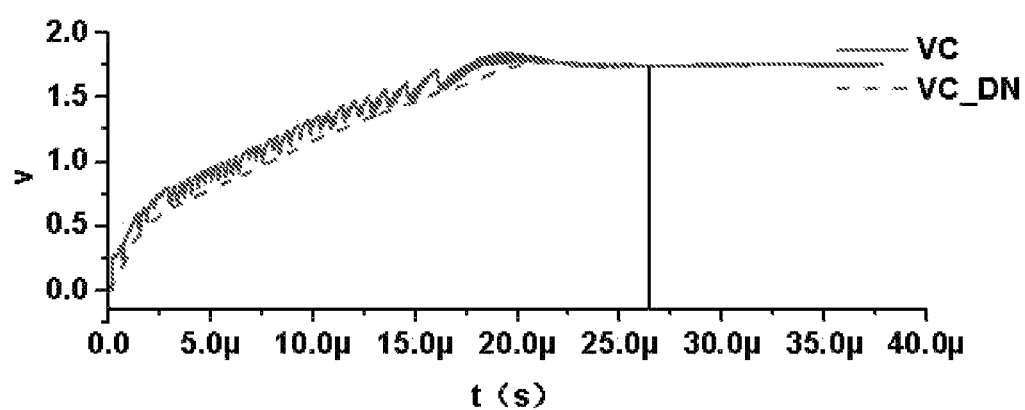
FIG. 8 is an oscillogram of a voltage VC_out of a signal output end of a low pass filter and a capacitance input terminal VC_DN of the low pass filter in a conventional phase-locked loop system before and after phase locking.
Figure 9:
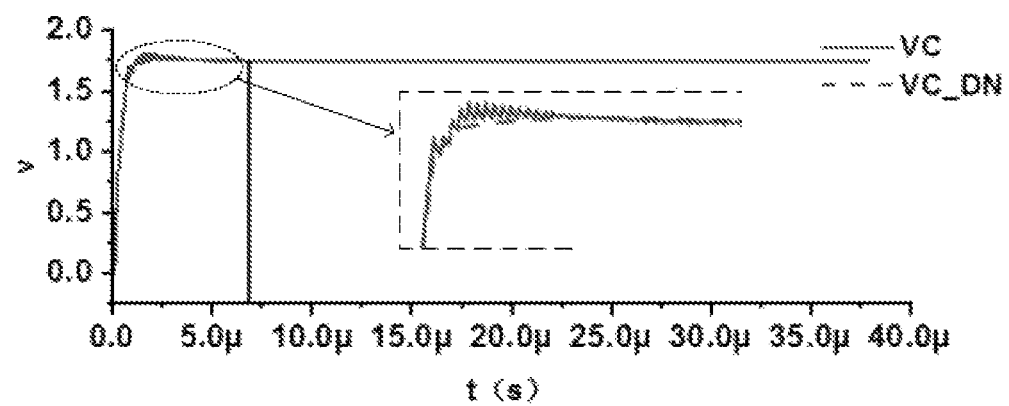
FIG. 9 is an oscillogram of a voltage VC_out of a signal output terminal of a low pass filter and a capacitance input terminal VC_DN of the low pass filter in a phase-locked loop system provided by an embodiment of the present disclosure before and after phase locking.

Acquired by simulation of an EDA tool, FIG. 8 is an oscillogram of the charge voltage VC_DN of the filter capacitor of the low pass filter and the voltage VC_out of the signal output terminal of the low pass filter in the unimproved conventional phase-locked loop system before and after phase locking, and FIG. 9 is an oscillogram of a voltage VC_out of a signal output terminal of a low pass filter and a capacitance input terminal VC_DN of the low pass filter in a phase-locked loop system provided by an embodiment of the present disclosure before and after phase locking. A simulation result is shown in FIG. 8 and FIG. 9. In the beginning of starting the phase-locked loop system, i.e., t0, VC_out and VC_DN are raised from 0. The increase amplitude and the increase speed of the VC_out on each time node are greater than VC ND, the changing trends of VC_out and VC_DN are consistent, and VC_out is increased first and decreased then to be stable in oscillation. The stabilizing times of VC_out and VC_DN in FIG. 9 are approximate to 7 us, the stabilizing times of VC_out and VC_DN in FIG. 8 are approximate to 28 us, the phase-locked acceleration circuit accelerates a phase-locked progress, and compared with a conventional phase-locked loop structure, the phase-locked acceleration circuit provided by the embodiment shortens the phase-locked stabilizing time of the phase-locked system thereof by about 75%.

Based on the phase-locked acceleration circuit, the present disclosure further provides a phase-locked loop system. The phase-locked loop system includes a phase-locked acceleration circuit. Related phase-locked acceleration related technical characteristics in the phase-locked loop system may refer to the embodiment, and, it is not described in detail.

As shown in FIG. 1, the phase-locked loop system includes a phase frequency detector, configured to detect a frequency difference and a phase difference between the external configured and input reference clock signal fref and the external feedback clock signal fbk to generate the pulse control signal until phases of the reference clock signal fref and the external feedback clock signal fbk change synchronously; a charge pump, configured to generate a charge current and a discharge current according to the pulse control signal output by the phase frequency detector; a low pass filter, configured to convert a current control signal output by the charge pump into a control voltage and filter out high frequency noises; a voltage-controlled oscillator, configured to control a oscillating frequency of a output signal of the voltage-controlled oscillator according to the control voltage output by the low pass filter, increase the oscillating frequency of the output signal when the control voltage increases and decrease the oscillating frequency of the output signal when the control voltage decreases, and keeping the oscillating frequency of the output signal at a constant value when the control voltage is stable; and a frequency divider, configured to divide a frequency of the output signal fout of the voltage-controlled oscillator to generate the feedback clock signal fbk input into the phase frequency detector. In the phase-locked loop system, the phase frequency detector, the charge pump, the low pass filter, the voltage-controlled oscillator and the frequency divider are successively connected to form a feedback loop. The phase-locked loop system further includes the phase-locked acceleration circuit in the embodiment. The phase-locked acceleration circuit includes the pulse width extraction control circuit and the current injection switch module.

The phase-locked acceleration circuit integrates the comparators, a time sequence logic circuit and a combination logic circuit to compare the low pulse widths of the control signal UP output by the phase frequency detector in different phase-locked regulating stages, wherein the enabling control signal EN of the phase-locked acceleration circuit generates a series of delay signals by means of delay level of the pulse width extraction control circuit and generates the pulse width extraction section by means of the pulse width extraction array. The low pulse width information, reflecting the signal UP, extracted by the pulse width extraction array is input to the control signal generation module. Injection of the charges into the capacitance terminal VC_DN of the low pass filter to the current injection switch module is turned off at the phase-locked stable moment.

The pulse width extraction control circuit controls a condition that the current injection switch module of the phase-locked acceleration circuit injects charges into the low pass filter according to a duty ratio change condition of the inverted signal of the pulse control signal output by the phase frequency detector until the phases of the reference clock signal and the feedback clock signal inputted by the phase frequency detector are synchronized, such that the phase-locked time of the feedback loop is shortened by the phase-locked acceleration circuit. According to the embodiment, the external enabling control signal is delayed to obtain (n+3) delay levels, and corresponding pulse width information is extracted from a control signal which reflects a phase difference between the reference clock signal and the feedback clock signal output by the phase frequency detector as the voltage signal for injecting switching control in the current injection switch module subsequently, wherein the pulse width information is a ground of pulse width extraction and the reliability of a conducting result of the current injection switch module is guaranteed by the switching D trigger. Therefore, the phase locking time of the phase-locked loop system is shortened, it is ensured that the stability of the control voltage output by the low pass filter is unchanged and the system characteristics, the transfer function and the noise performance are unchanged, and the control voltage can be applied to other phase-locked loop systems in an expanded manner without changing apparatus parameters and loop parameters.

Finally, it should be noted that the above embodiments are only used to explain the technical scheme of the present disclosure and shall not be construed as limitation. Despite reference to the aforementioned embodiments to make a detailed description for the present disclosure, it will be understood by those skilled in the art that they still can modify the specific embodiments of the present disclosure or make equivalent substitutions on part of technical features therein. Such modifications or substitutions without departing the spirit of the technical scheme of the present disclosure shall come within the range of the technical scheme claimed by the present disclosure.

What is claimed is:

1. A control signal pulse width extraction-based phase-locked acceleration circuit, phase-locked loops suitable for the phase-locked acceleration circuit comprising a phase frequency detector, a charge pump, a low pass filter, a voltage-controlled oscillator and a frequency divider, and the phase frequency detector, the charge pump, the low pass filter, the voltage-controlled oscillator and the frequency divider are connected in turn to form a feedback loop; wherein the phase-locked acceleration circuit comprises a pulse width extraction control circuit and a current injection switch module;

the pulse width extraction control circuit comprises a driving input terminal, an enabling control terminal and a control output terminal; the current injection switch module comprises a current step-by-step control terminal and a current injection control terminal;

the enabling control terminal of the pulse width extraction control circuit is connected with an external enabling signal source and is configured to control the phase-locked loop to work;

the control output terminal of the pulse width extraction control circuit is connected with the current injection control terminal of the current injection switch module, both the current step-by-step control terminal of the current injection switch module and the driving input terminal of the pulse width extraction control circuit are connected to a preset control signal output terminal of the phase frequency detector respectively, so as to control the current injection switch module to inject charges into the low pass filter according to a change of pulse width of a output signal of the preset control signal output terminal until a phase of a reference clock signal and a phase of a feedback clock signal which are inputted by the phase frequency detector are synchronized; the output signal of the preset control signal output terminal is an inverted signal of a control signal output by the phase frequency detector to control the charge pump to inject charges;

a signal input terminal of the low pass filter is connected with a signal output terminal of the charge pump, a capacitance input terminal of the low pass filter is connected with a signal output terminal of the current injection switch module, so as to receive charges injected by the signal output terminal of the current injection switch module while receiving charges provided by the signal output terminal of the charge pump and to generate a control voltage from accumulated charges and output the control voltage to the voltage-controlled oscillator, the capacitance input terminal of the low pass filter is a connective node of a resistor and a capacitor in series in a resistance-capacitance series branch in the low pass filter.

2. The phase-locked acceleration circuit according to claim 1, wherein the current injection switch module comprises a power supply, a first zero N-Metal-Oxide-Semiconductor (NMOS) tube, a second zero NMOS tube and a first zero Positive-channel-Metal-Oxide-Semiconductor (PMOS) tube, a source electrode of the first zero NMOS tube is connected with a drain electrode of the second zero NMOS tube, a gate electrode is connected with a drain electrode of the first zero NMOS tube, and the drain electrode is connected with the power supply;

a source electrode of the second zero NMOS tube is connected with a source electrode of the first zero PMOS tube, and a gate electrode of the second zero NMOS tube is connected with the preset control signal output as the step-by-step control terminal of the current injection switch module, and the gate electrode of the second zero NMOS is configured to change a conduction condition of the second zero NMOS tube according to a jump state of the output signal of the preset control signal output terminal to inject current step-by-step by the current injection switch module;

and a gate electrode is connected with the control output terminal of the pulse width extraction control circuit as the current injection control terminal of the current injection switch module; and a drain electrode as a signal output terminal of the current injection switch module is connected with the capacitance input terminal of the low pass filter.

3. The phase-locked acceleration circuit according to claim 2, wherein the delay control module comprises a delay level generation array, a pulse width extraction array and a control signal generation module, wherein the driving input terminal is connected with a clock input terminal arranged in the delay level generation array, and the enabling control terminal is connected with a data input terminal arranged in the delay level generation array;

the delay level generation array internally comprises (n+3) cascaded D triggers which are corresponding to (n+3) data output, a D trigger connected with the enabling control terminal is a first level D trigger, the number of stages of cascaded pulse width extraction units is the same as a smaller stage of two adjacent cascaded D triggers connected with the cascaded pulse width extraction unit;

the pulse width extraction array comprises (n+2) cascaded pulse width extraction units, each of the (n+2) cascaded pulse width extraction units comprises two pulse input terminals, one charge discharge control terminal, one driving terminal and one pulse width information output terminal, two adjacent cascaded pulse width extraction units share a common pulse input terminal, and the driving terminals of the (n+2) cascaded pulse width extraction units are connected with a time clock input terminal arranged in the delay level generation array;

the data output terminals of the two adjacent cascaded D triggers in the delay level generation array are correspondingly connected to two pulse input terminals of the pulse width extraction unit with matched stage number in the pulse width extraction array; and in the delay level generation array, an inverting output terminal of each of the D triggers connected with the enabling control terminal is connected with the charge discharge control terminal of each of the pulse with extraction units;

the control signal generation module comprises n comparators, a non-inverting input terminal and a inverting input terminal of each of the n comparators are respectively connected with the pulse width information output terminals of two adjacent cascaded pulse width extraction unit respectively, each of two adjacent comparators has only one input terminal connected to the pulse width information output terminal of one pulse width extraction unit, properties of input terminals of the two adjacent comparators connected with one pulse width information output terminal of one pulse width extraction unit are different, and the input terminals of two comparators which are not adjacent are not connected with one pulse width information output terminal of one pulse width extraction unit, and the number of stage of the pulse width extraction unit connected with the non-inverting input terminal of the comparator is greater than the number of stage of the pulse width extraction unit connected with the inverting input terminal of a same comparator.

4. The phase-locked acceleration circuit according to claim 1, wherein the delay control module comprises a delay level generation array, a pulse width extraction array and a control signal generation module, wherein the driving input terminal is connected with a clock input terminal arranged in the delay level generation array, and the enabling control terminal is connected with a data input terminal arranged in the delay level generation array;

the delay level generation array internally comprises (n+3) cascaded D triggers which are corresponding to (n+3) data output, a D trigger connected with the enabling control terminal is a first level D trigger, the number of stages of cascaded pulse width extraction units is the same as a smaller stage of two adjacent cascaded D triggers connected with the cascaded pulse width extraction unit;

the pulse width extraction array comprises (n+2) cascaded pulse width extraction units, each of the (n+2) cascaded pulse width extraction units comprises two pulse input terminals, one charge discharge control terminal, one driving terminal and one pulse width information output terminal, two adjacent cascaded pulse width extraction units share a common pulse input terminal, and the driving terminals of the (n+2) cascaded pulse width extraction units are connected with a time clock input terminal arranged in the delay level generation array;

the data output terminals of the two adjacent cascaded D triggers in the delay level generation array are correspondingly connected to two pulse input terminals of the pulse width extraction unit with matched stage number in the pulse width extraction array; and in the delay level generation array, an inverting output terminal of each of the D triggers connected with the enabling control terminal is connected with the charge discharge control terminal of each of the pulse with extraction units;

the control signal generation module comprises n comparators, a non-inverting input terminal and a inverting input terminal of each of the n comparators are respectively connected with the pulse width information output terminals of two adjacent cascaded pulse width extraction unit respectively, each of two adjacent comparators has only one input terminal connected to the pulse width information output terminal of one pulse width extraction unit, properties of input terminals of the two adjacent comparators connected with one pulse width information output terminal of one pulse width extraction unit are different, and the input terminals of two comparators which are not adjacent are not connected with one pulse width information output terminal of one pulse width extraction unit, and the number of stage of the pulse width extraction unit connected with the non-inverting input terminal of the comparator is greater than the number of stage of the pulse width extraction unit connected with the inverting input terminal of a same comparator.

5. The phase-locked acceleration circuit according to claim 4, wherein in the delay level generation array, a connecting structure of the (n+3) cascaded D triggers is as flows:

a data input terminal of the first D trigger is connected with the enabling control terminal;

in two adjacent cascaded D triggers, a data input terminal of a next D trigger is connected with a data output terminal of a previous D trigger; and a clock terminal of each D trigger is connected with the driving input terminal, and a reset terminal of each D trigger is connected with the enabling control terminal.

6. The phase-locked acceleration circuit according to claim 4, wherein the pulse width extraction array comprises a power supply and the (n+2) cascaded pulse width extraction units; each of the (n+2) cascaded pulse width extraction units comprises a pulse width testing NMOS tube, a pulse width testing PMOS tube, a switching PMOS tube, a reset control NMOS tube and a capacitor;

in a n-th pulse width extraction unit, a gate electrode of the pulse width testing NMOS tube is connected with a data output terminal of a n-th D trigger in the delay level generation array, a gate electrode of the pulse width testing PMOS tube is connected with a data output terminal of a (n+1)-th D trigger in the delay level generation array, wherein the number of stage of the n-th D trigger and the number of stage of the n-th pulse width extraction unit are equal, the (n+1)-th D trigger and the n-th D trigger are in an adjacent cascaded connecting relationship to meet a condition that data output terminals of the two adjacent cascaded D triggers in the delay level generation array are correspondingly connected to two pulse input terminals of the pulse width extraction units with matched stage number in the pulse width extraction array, and the gate electrode of the pulse width testing NMOS tube and the gate electrode of the pulse width testing PMOS tube are taken as the two pulse input terminals respectively;

in each pulse width extraction unit, a source electrode of the pulse width testing PMOS tube is connected with the power supply, a drain electrode of the pulse width testing PMOS tube is connected with a drain electrode of the pulse width testing NMOS tube, a source electrode of the pulse width testing NMOS tube is connected with a source electrode of the switching PMOS tube, a gate electrode of the switching PMOS tube is taken as the driving terminal of the pulse width extraction unit, a gate electrode of the reset control NMOS tube is taken as the charge discharge control terminal, a drain electrode of the reset control NMOS tube is connected with a drain electrode of the switching PMOS tube and an upper plate of the capacitor, a connective node of the drain electrode of the reset control NMOS tube and the upper plate of the capacitor is taken as the pulse width information output terminal, and a lower plate of the capacitor and a source electrode of the reset control NMOS tube are earthed;

wherein the gate electrodes of the switching PMOS tubes of all the cascaded pulse width extraction units are connected to the clock input terminal, the gate electrodes of the reset control switching NMOS tubes of all the cascaded pulse width extraction units are connected to an inverting output terminal of the first D trigger.

7. The phase-locked acceleration circuit according to claim 4, wherein the control signal generation module comprises the n comparators, an or-logic circuit and a switching D trigger;

The non-inverting input terminal and the inverting input terminal of each of the n comparators are respectively connected with the pulse width information output terminals of the two adjacent cascaded pulse width extraction unit respectively from a second stage pulse width extraction unit according to a cascading sequence in the pulse width extraction array, the inverting input terminal of the comparator is connected with the pulse width information output terminal of the pulse width extraction unit with a smaller stage, and the non-inverting input terminal of the comparator is connected with the pulse width information output terminal of the pulse width extraction unit with the greater stage;

signal output terminals of the n comparators are connected to n input terminals of the or-logic circuit respectively, output terminal of the or-logic circuit is connected to a clock terminal of the switching D trigger, both a data input terminal and a reset terminal of the switching D trigger are connected with the enabling control terminal, and a data output terminal of the switching D trigger is taken as the control output terminal of the pulse width extraction control circuit;

wherein the or-logic circuit comprises a plurality of or gates or corresponding combinational logic circuits.

8. A phase-locked loop system, comprising:

a phase frequency detector, configured to detect a frequency difference and a phase difference between an input reference clock signal and a feedback clock signal to generate a pulse control signal;

a charge pump, configured to generate a charge current and a discharge current according to the pulse control signal output by the phase frequency detector;

a low pass filter, configured to convert a current control signal output by the charge pump into a control voltage and filter out high frequency noises;

a voltage-controlled oscillator, configured to control a oscillating frequency of a output signal of the voltage-controlled oscillator according to the control voltage output by the low pass filter, increase the oscillating frequency of the output signal when the control voltage increases and decrease the oscillating frequency of the output signal when the control voltage decreases, and keeping the oscillating frequency of the output signal at a constant value when the control voltage is stable;

a frequency divider, configured to divide a frequency of the output signal of the voltage-controlled oscillator to generate the feedback clock signal of the phase frequency detector, wherein the phase frequency detector, the charge pump, the low pass filter, the voltage-controlled oscillator and the frequency divider are connected in turn to form a feedback loop;

further comprising a phase-locked acceleration circuit, wherein a pulse width extraction control circuit of the phase-locked acceleration circuit controls a condition that a current injection switch module of the phase-locked acceleration circuit injects charges into the low pass filter according to a change condition of a duty ratio of an inverted signal of the pulse control signal output by the phase frequency detector until the phases of a reference clock signal and the feedback clock signal input by the phase frequency detector are synchronized, such that the phase-locked acceleration circuit shortens a phase-locked time of the feedback loop, phase-locked loops suitable for the phase-locked acceleration circuit comprising a phase frequency detector, a charge pump, a low pass filter, a voltage-controlled oscillator and a frequency divider, and the phase frequency detector, the charge pump, the low pass filter, the voltage-controlled oscillator and the frequency divider are connected in turn to form a feedback loop;

wherein the phase-locked acceleration circuit comprises a pulse width extraction control circuit and a current injection switch module;

the pulse width extraction control circuit comprises a driving input terminal, an enabling control terminal and a control output terminal; the current injection switch module comprises a current step-by-step control terminal and a current injection control terminal;

the enabling control terminal of the pulse width extraction control circuit is connected with an external enabling signal source and is configured to control the phase-locked loop to work;

the control output terminal of the pulse width extraction control circuit is connected with the current injection control terminal of the current injection switch module, both the current step-by-step control terminal of the current injection switch module and the driving input terminal of the pulse width extraction control circuit are connected to a preset control signal output terminal of the phase frequency detector respectively, so as to control the current injection switch module to inject charges into the low pass filter according to a change of pulse width of a output signal of the preset control signal output terminal until a phase of a reference clock signal and a phase of a feedback clock signal which are inputted by the phase frequency detector are synchronized; the output signal of the preset control signal output terminal is an inverted signal of a control signal output by the phase frequency detector to control the charge pump to inject charges;

a signal input terminal of the low pass filter is connected with a signal output terminal of the charge pump, a capacitance input terminal of the low pass filter is connected with a signal output terminal of the current injection switch module, so as to receive charges injected by the signal output terminal of the current injection switch module while receiving charges provided by the signal output terminal of the charge pump and to generate a control voltage from accumulated charges and output the control voltage to the voltage-controlled oscillator, the capacitance input terminal of the low pass filter is a connective node of a resistor and a capacitor in series in a resistance-capacitance series branch in the low pass filter.

9. The A phase-locked loop system according to claim 8, wherein the current injection switch module comprises a power supply, a first zero N-Metal-Oxide-Semiconductor (NMOS) tube, a second zero NMOS tube and a first zero Positive-channel-Metal-Oxide-Semiconductor (PMOS) tube, a source electrode of the first zero NMOS tube is connected with a drain electrode of the second zero NMOS tube, a gate electrode is connected with a drain electrode of the first zero NMOS tube, and the drain electrode is connected with the power supply;

a source electrode of the second zero NMOS tube is connected with a source electrode of the first zero PMOS tube, and a gate electrode of the second zero NMOS tube is connected with the preset control signal output as the step-by-step control terminal of the current injection switch module, and the gate electrode of the second zero NMOS is configured to change a conduction condition of the second zero NMOS tube according to a jump state of the output signal of the preset control signal output terminal to inject current step-by-step by the current injection switch module;

and a gate electrode is connected with the control output terminal of the pulse width extraction control circuit as the current injection control terminal of the current injection switch module; and a drain electrode as a signal output terminal of the current injection switch module is connected with the capacitance input terminal of the low pass filter.

10. The phase-locked loop system according to claim 8, wherein the delay control module comprises a delay level generation array, a pulse width extraction array and a control signal generation module, wherein the driving input terminal is connected with a clock input terminal arranged in the delay level generation array, and the enabling control terminal is connected with a data input terminal arranged in the delay level generation array;

the delay level generation array internally comprises (n+3) cascaded D triggers which are corresponding to (n+3) data output, a D trigger connected with the enabling control terminal is a first level D trigger, the number of stages of cascaded pulse width extraction units is the same as a smaller stage of two adjacent cascaded D triggers connected with the cascaded pulse width extraction unit;

the pulse width extraction array comprises (n+2) cascaded pulse width extraction units, each of the (n+2) cascaded pulse width extraction units comprises two pulse input terminals, one charge discharge control terminal, one driving terminal and one pulse width information output terminal, two adjacent cascaded pulse width extraction units share a common pulse input terminal, and the driving terminals of the (n+2) cascaded pulse width extraction units are connected with a time clock input terminal arranged in the delay level generation array;

the data output terminals of the two adjacent cascaded D triggers in the delay level generation array are correspondingly connected to two pulse input terminals of the pulse width extraction unit with matched stage number in the pulse width extraction array; and in the delay level generation array, an inverting output terminal of each of the D triggers connected with the enabling control terminal is connected with the charge discharge control terminal of each of the pulse with extraction units;

the control signal generation module comprises n comparators, a non-inverting input terminal and a inverting input terminal of each of the n comparators are respectively connected with the pulse width information output terminals of two adjacent cascaded pulse width extraction unit respectively, each of two adjacent comparators has only one input terminal connected to the pulse width information output terminal of one pulse width extraction unit, properties of input terminals of the two adjacent comparators connected with one pulse width information output terminal of one pulse width extraction unit are different, and the input terminals of two comparators which are not adjacent are not connected with one pulse width information output terminal of one pulse width extraction unit, and the number of stage of the pulse width extraction unit connected with the non-inverting input terminal of the comparator is greater than the number of stage of the pulse width extraction unit connected with the inverting input terminal of a same comparator.

11. The phase-locked loop system according to claim 10, wherein in the delay level generation array, a connecting structure of the (n+3) cascaded D triggers is as flows:

a data input terminal of the first D trigger is connected with the enabling control terminal;

in two adjacent cascaded D triggers, a data input terminal of a next D trigger is connected with a data output terminal of a previous D trigger; and a clock terminal of each D trigger is connected with the driving input terminal, and a reset terminal of each D trigger is connected with the enabling control terminal.

12. The phase-locked loop system according to claim 10, wherein the pulse width extraction array comprises a power supply and the (n+2) cascaded pulse width extraction units; each of the (n+2) cascaded pulse width extraction units comprises a pulse width testing NMOS tube, a pulse width testing PMOS tube, a switching PMOS tube, a reset control NMOS tube and a capacitor;

in a n-th pulse width extraction unit, a gate electrode of the pulse width testing NMOS tube is connected with a data output terminal of a n-th D trigger in the delay level generation array, a gate electrode of the pulse width testing PMOS tube is connected with a data output terminal of a (n+1)-th D trigger in the delay level generation array, wherein the number of stage of the n-th D trigger and the number of stage of the n-th pulse width extraction unit are equal, the (n+1)-th D trigger and the n-th D trigger are in an adjacent cascaded connecting relationship to meet a condition that data output terminals of the two adjacent cascaded D triggers in the delay level generation array are correspondingly connected to two pulse input terminals of the pulse width extraction units with matched stage number in the pulse width extraction array, and the gate electrode of the pulse width testing NMOS tube and the gate electrode of the pulse width testing PMOS tube are taken as the two pulse input terminals respectively;

in each pulse width extraction unit, a source electrode of the pulse width testing PMOS tube is connected with the power supply, a drain electrode of the pulse width testing PMOS tube is connected with a drain electrode of the pulse width testing NMOS tube, a source electrode of the pulse width testing NMOS tube is connected with a source electrode of the switching PMOS tube, a gate electrode of the switching PMOS tube is taken as the driving terminal of the pulse width extraction unit, a gate electrode of the reset control NMOS tube is taken as the charge discharge control terminal, a drain electrode of the reset control NMOS tube is connected with a drain electrode of the switching PMOS tube and an upper plate of the capacitor, a connective node of the drain electrode of the reset control NMOS tube and the upper plate of the capacitor is taken as the pulse width information output terminal, and a lower plate of the capacitor and a source electrode of the reset control NMOS tube are earthed;

wherein the gate electrodes of the switching PMOS tubes of all the cascaded pulse width extraction units are connected to the clock input terminal, the gate electrodes of the reset control switching NMOS tubes of all the cascaded pulse width extraction units are connected to an inverting output terminal of the first D trigger.

13. The phase-locked loop system according to claim 10, wherein the control signal generation module comprises the n comparators, an or-logic circuit and a switching D trigger;

The non-inverting input terminal and the inverting input terminal of each of the n comparators are respectively connected with the pulse width information output terminals of the two adjacent cascaded pulse width extraction unit respectively from a second stage pulse width extraction unit according to a cascading sequence in the pulse width extraction array, the inverting input terminal of the comparator is connected with the pulse width information output terminal of the pulse width extraction unit with a smaller stage, and the non-inverting input terminal of the comparator is connected with the pulse width information output terminal of the pulse width extraction unit with the greater stage;

signal output terminals of the n comparators are connected to n input terminals of the or-logic circuit respectively, output terminal of the or-logic circuit is connected to a clock terminal of the switching D trigger, both a data input terminal and a reset terminal of the switching D trigger are connected with the enabling control terminal, and a data output terminal of the switching D trigger is taken as the control output terminal of the pulse width extraction control circuit;

wherein the or-logic circuit comprises a plurality of or gates or corresponding combinational logic circuits.

\* \* \* \* \*